United States Patent [19]

Opower

[11] Patent Number: 5,736,464
[45] Date of Patent: Apr. 7, 1998

[54] PROCESS AND APPARATUS FOR PRODUCING A FUNCTIONAL STRUCTURE OF A SEMICONDUCTOR COMPONENT

[75] Inventor: Hans Opower, Krailling, Germany

[73] Assignee: Deutsche Forschungsanstalt fuer Luft-und Raumfahrt e.V., Bonn, Germany

[21] Appl. No.: 450,106

[22] Filed: May 25, 1995

Related U.S. Application Data

[62] Division of Ser. No. 112,785, Aug. 26, 1993, abandoned.

[30] Foreign Application Priority Data

Sep. 3, 1992 [DE] Germany .......................... 42 29 399.5

[51] Int. Cl.$^6$ .................................................. H01L 21/268
[52] U.S. Cl. ............................ 438/707; 427/597; 216/65; 148/DIG. 93
[58] Field of Search .................................. 427/561, 597, 427/596, 572, 586; 204/192.1, 192.11, 298.01, 298.02, 298.04; 148/DIG. 158, DIG. 93; 437/173, 225; 438/707, 940; 216/65

[56] References Cited

U.S. PATENT DOCUMENTS

| | | |
|---|---|---|
| 4,335,266 | 6/1982 | Mickelsen et al. . |
| 4,432,855 | 2/1984 | Romankiw et al. . |
| 4,497,692 | 2/1985 | Gelchinski et al. . |
| 4,664,940 | 5/1987 | Bensoussan et al. ............... 204/192.1 |
| 4,724,219 | 2/1988 | Ridinger . |
| 4,868,068 | 9/1989 | Yamaguchi et al. ................ 427/596 X |
| 4,895,735 | 1/1990 | Cook . |
| 4,970,196 | 11/1990 | Kim et al. . |
| 5,015,492 | 5/1991 | Venkatesan et al. . |
| 5,017,277 | 5/1991 | Yoshida et al. . |
| 5,037,521 | 8/1991 | Nishikawa et al. . |
| 5,084,300 | 1/1992 | Zander et al. . |
| 5,097,793 | 3/1992 | Shuhara et al. . |
| 5,158,931 | 10/1992 | Node et al. ......................... 427/572 X |
| 5,209,944 | 5/1993 | Opower et al. . |
| 5,231,047 | 7/1993 | Ovshinsky et al. . |
| 5,246,885 | 9/1993 | Braren et al. . |
| 5,248,658 | 9/1993 | Yamagzaki .......................... 427/596 |

OTHER PUBLICATIONS

Shao, et al., "Polycrystalline CdTe Solar Cells by Pulsed Laser Deposition," Abstract from Twenty–Second IEEE Photovoltaic Specialists Conference, 1991, p. 957.

M. Hanabusa, "Photo–Excited Processes Related to Semiconductor Technology," *Thin Solid Films*, vol. 218 (1992), pp. 144–150.

Y. Hiura et al., "Laser Chemical Vapor Deposition Direct Patterning of Insulating Film," *Journal of Applied Physics*, vol. 69(3), Feb. 1, 1991, pp. 1744–1747.

V.M. Donnelly, et al., "Selected Area Growth of GaAs by Laser–Induced Pyrolysis of Adsorbed Triethylgallium," *Applied Physics Letter*, vol. 54(24), Jun. 12, 1989, pp. 2458–2460.

J. Brannon, "Excimer Laser Induced Micron–Size Pattern Etching by Image Projection," *Materials Research Society Symposium Proceedings*, vol. 101, Dec. 1–3, 1987, pp. 27–31.

*Primary Examiner*—Nam Nguyen
*Attorney, Agent, or Firm*—Barry R. Lipsitz; Ralph F. Hoppin

[57] ABSTRACT

In order to improve a process and an apparatus for producing a functional structure of a semiconductor component, which comprises layers arranged on a base substrate and defining the entire functions of the semiconductor component, such that the functional structure of the semiconductor components can be produced as simply as possible and with as little susceptibility as possible with respect to the quality of the semiconductor components it is suggested that all the layers be produced without lithography and applied to the base substrate one after the other exclusively with physical layer application processes.

30 Claims, 15 Drawing Sheets

PROCESS AND APPARATUS FOR PRODUCING A FUNCTIONAL STRUCTURE OF A SEMICONDUCTOR COMPONENT

This application is a divisional of commonly assigned, U.S. patent application Ser. No. 08/112,785 filed Aug. 26, 1993, abandoned.

BACKGROUND OF THE INVENTION

The invention relates to a process and an apparatus for producing a functional structure of a semiconductor component which comprises layers arranged on a base substrate and defining the entire functions of the semiconductor component.

In accordance with the technology customary today, a plurality of process steps are performed for the production of semiconductor components. These steps are carried out partially under vacuum conditions and partially under normal atmospheric pressure and chemical substances and foreign materials are used in them.

For example, the following processes are carried out: Chemical cleaning of the substrates, repeated structuring and doping of layers using photolithography which comprises application of a photoresist layer, exposure, development and etching of the substrate. Moreover, metallizations by chemical depositions of metal layers are also required.

The known technology is extremely susceptible with respect to the resulting quality of semiconductor components since the substrate comes into contact with a plurality of foreign substances. This means that the possibilities of soiling occurring are numerous and these finally impair the quality of the semiconductor components.

The object underlying the invention is therefore to improve a process of the generic type such that the functional structure of the semiconductor components can be produced as simply as possible and with as little susceptibility as possible with respect to the quality of the semiconductor components.

SUMMARY OF THE INVENTION

This object is accomplished in accordance with the invention, in a process of the type described at the outset, in that all the layers are produced without lithography and applied to the base substrate one after the other exclusively with physical layer application processes. The inventive solution has the great advantage that far less problems result with respect to the quality yield since the substrate and also the layers applied do not come into contact with foreign matter. Moreover, the inventive process does not require the use of chemicals which are a burden on the environment.

Finally, the inventive process also enables the production cycle to be more rational and less complicated than that known from the state of the art.

In the inventive process, it would be possible, for example, and as is customary in the known process technology for semiconductor components, to begin the process with a substrate which has specific properties and from which material is partially removed and layers are subsequently applied.

The inventive process can be carried out particularly efficiently when the layers are produced on the substrate by way of superposed application thereof.

In this respect, it is particularly expedient for each layer to be applied each time in the form of an uppermost layer on a process substrate produced in preceding processes.

A process substrate is to be understood as a substrate which serves in the inventive process as a basis for the application of a layer. This can, therefore, be a base substrate, to which no layer has yet been applied, or a base substrate which already has one or more layers and serves as carrier for an additional layer.

The advantage of the mode of operation described above is to be seen in the fact that the build-up and composition of the layers can then be controlled and influenced in a simple manner when this is the respective uppermost layer of the process substrate.

The physical layer application process can, in principle, operate with any type of energy source, for example even with an electron beam. It is, however, particularly advantageous for laser radiation acting on the layer material to be used during the application of the layers since laser radiation is especially easy to focus and, with respect to the beam guidance, simple to handle.

The layer material can then be present in a target or as a layer already applied.

It has proven to be particularly expedient for pulsed laser radiation to be used since, in this case, high energy in a pulse is available for the coating processes in a concentrated manner and, in particular, localized processes can then be generated and controlled.

In an advantageous embodiment of the inventive process, for example, at least one of the layers is applied by irradiation of at least one target comprising layer material with, in particular, pulsed laser radiation.

The invention provides, in particular, for the layer to be applied by formation of a plasma at the target and migration of layer material particles from the target to the process substrate and deposition on a surface of the process substrate.

A production of layers of this type is known, for example, from German patent 40 22 817.

When applying the layers of a functional structure one has to differentiate between unstructured and structured layers. Unstructured layers are those layers which expand over the entire substrate with the desired thickness throughout and do not comprise any structure, i.e. openings or singularities or the like, in the plane of their extension on the substrate. Structured layers, on the other hand, are layers which do not extend continuously in the plane in which they extend but, for example, cover defined surface regions or comprise webs etc.

With the inventive process, an unstructured layer is advantageously applied by irradiation of the target on a surface facing the process substrate, preferably while forming a plasma thereon. In this respect, a layer application is possible in a simple manner since particles from the layer material migrate from the plasma on the surface of the target in the direction of the process substrate, preferably in the form of a cone extending at right angles to the surface, and are deposited on the process substrate in the region of the point of intersection of the cone with its surface.

This has the advantage that due to the formation of a plasma at the target essentially cluster-free layers may be applied to the process substrate and so the layers have the same quality, with respect to their atomic structure, as, for example, previously known crystalline or amorphous semiconductor layers.

A structured layer is expediently produced in accordance with the invention in that a defined movement of a focused laser beam over the process substrate takes place in accordance with the respective structure.

In an advantageous embodiment, the structured layer is produced by removal of material by means of the laser beam from a layer of the process substrate already applied, i.e. a layer already applied, for example as described in the above for unstructured layers, is structured by parts thereof being subsequently removed again by means of a laser beam moved in a defined manner.

Alternatively, in one embodiment a structured layer is produced by irradiation of a thin-layer target on a side remote from the process substrate, i.e. material is applied to the surface of the process substrate from the thin-layer target which is irradiated on its side remote from the process substrate since the layer material also expands in the direction of the substrate due to the influence of the laser beam and this is preferably the layer material located in the region of the focus of the laser beam.

It is, therefore, particularly advantageous for the structured layer to be produced by defined guidance of the laser beam on the side of the target remote from the process substrate so that a defined application of the layer material to the surface of the substrate already takes place and the structuring need not, therefore, be carried out by subsequent removal of material.

This does not, however, exclude the fact that even such a layer already applied as a structured layer will still be subsequently structured by way of a layer removal by a laser beam or provided with additional structures.

The structured application of a layer by means of the thin-layer target is advantageously possible, in particular, when the thin-layer target is arranged at a slight distance from the surface of the process substrate so that an application of layer material to the process substrate takes place only in the region opposite the focus.

The thin-layer target is preferably arranged at a distance from the surface of the process substrate of less than ten times a focus diameter, even better of less than 10 µm. However, it is, for example, possible for the thin-layer target to be placed directly onto the surface of the process substrate.

An inventive thin-layer target may be used in numerous different forms. In one embodiment, for example, the thin-layer target is a foil arranged over the process substrate and at a slight distance therefrom.

Alternatively, it is advantageous for the thin-layer target to be a film arranged on a carrier irradiatable with the laser beam. Such a film has, preferably, a thickness of less than 100 nm, preferably in the range of approximately 5 to approximately 30 nm.

No details have so far been given as to how the layers are intended to be built up in the inventive process. It would, for example, be possible to produce the layers in one step up to the respective required thickness.

It is, however, particularly advantageous for each layer to be built up of part layers applied one after the other and overlapping. This is expedient, in particular, in conjunction with the use of a laser beam with laser pulses since an application of one or a few atom layers takes place per laser pulse in a partial area of the layer to be applied. Due to the overlapping and successive application of part layers, a very homogeneous layer can, in particular, be constructed.

It is particularly advantageous for each layer to be applied with a functionally ready layer material composition so that, afterwards, no alteration need be made to the layer, i.e. no subsequent doping of the applied layer is, for example, necessary.

The inventive process can be used particularly efficiently when the functionally ready layer material composition results from the layer build up from individual components, i.e., when the layer build up does not result from a target comprising all the components of the functionally ready layer material composition.

In one embodiment of a process, for example, a target comprises several individual targets which have components of the functionally ready layer material composition and are acted upon by the laser beam. In this respect, the laser beam acts, for example, on the individual targets with successive laser pulses. For example, it is conceivable for an individual target to be acted upon with a specific number of laser pulses, then to change to the next individual target with an additional specific number of laser pulses and, finally, for example, to a further individual target which can comprise, for example, the doping as material.

In order to obtain a uniform removal of the layer material from the target, it is advantageous for a focus of the laser beam to be moved relative to the target.

Moreover, to obtain a uniform coating on the surface of the process substrate the target is moved relative to the process substrate.

No details have been given in the embodiments described so far as to how the layers of the functional structure are intended to be applied. It would, for example, be conceivable for the layers to be applied in several batches. The inventive process is, however, particularly advantageous when the layers of the functional structure are applied in a plurality of successive stations as this means that a greater effectivity can be achieved than with the processes known from the state of the art.

In this respect, it is particularly expedient for the functional structure to be produced in a continuous process run so that the process substrates pass through the individual stations in one continuous step and at the end of the process run the entire functional structure is present.

With respect to the mode of operation of the entire process and, in particular, the application of the layers during the process, no precise details have so far been given. For example, it is advantageous for a coating station to be provided for the application of each layer.

In order to be able to perform the inventive process economically, the process substrate is transported from coating station to coating station.

Moreover, it is advantageous, in particular in order to attain the required quality of the semiconductor components, for each coating station to operate under high vacuum, i.e. for the coating to be carried out under high-vacuum or ultra-vacuum conditions.

In all the cases, in which the structuring of the layer is carried out by removal of material, it is advantageous for a structuring station to be provided from one of the coating stations, preferably following the coating station, for structuring layers.

In this respect, material is preferably removed with the laser beam in the structuring station for structuring the layer.

With respect to the arrangement of the coating stations relative to one another, no additional details have so far been given. For example, is it particularly advantageous for the individual coating stations to be spatially separated from one another.

The same applies to the structuring stations so that, preferably, the structuring stations are spatially separated from one another and from the coating stations.

No further details have so far been given concerning the type of operation in the structuring stations. In one embodiment, for example, the structuring station operates in a high-vacuum atmosphere.

In this case, it is expedient, in order to avoid any soiling of the optical focusing means for the laser beam, for a catching device to be provided for particles removed from the layer to be structured.

The catching device is preferably arranged such that the particles removed are guided to this device by means of an electrical or magnetic field.

Alternatively, it is conceivable for the structuring station to operate with a protective gas atmosphere. In this case, it is preferable for the particles of layer material removed to be transported away in the structuring station by means of protective gas.

The remarks concerning the build-up and the production of layers relate to the production of both semiconductor layers and insulator or other layers.

These remarks relate, in particular, to the application of a metal layer to the functional structure as uppermost layer so that the metallization is also applied by irradiation of a target by means of a laser beam.

Furthermore, and supplementary to the application of structured or unstructured layers for the functional structure, the inventive process also provides for the base substrate to be cleaned photolytically by means of a laser beam prior to the application of the layers.

The laser beam used for the photolytic cleaning is preferably a pulsed laser beam.

In order to achieve a photolytic cleaning of the base substrate, it is also necessary to move base substrate and laser beam relative to one another in order to cover the entire surface of the base substrate with the laser beam. This is possible by moving the base substrate relative to the stationary laser beam. It is, however, even more advantageous for the laser beam to be moved relative to the base substrate since a movement of the laser beam relative to the stationary base substrate can be carried out especially simply and quickly in order for the photolytic cleaning of the base substrate to be as effective and rapid as possible.

No remarks have so far been made regarding the type of laser beam.

It is particularly favourable for the application of the layers for the energy of the laser beam to be such that one or a few atom layers of the layer material are applied to the process substrate per laser pulse. The conditions for this are disclosed, for example, in German patent 40 22 817 and reference is made to the entire contents of this patent.

In this respect, it is particularly expedient for the laser pulse to have a duration of less than approximately 100 picoseconds. A pulse duration in the region of approximately 1 to 20 picoseconds is preferred.

In addition, it is advantageous, in order to attain an appreciable efficiency and an appreciable application of layer material to the process substrate, for the plasma-generating laser pulses to have a repetition rate in the range of approximately 10 kHz.

No details have so far been given regarding the wavelength of the laser radiation. It is particularly expedient, especially to bring about the advantageous conditions for the application of the layer material, for the laser radiation to have a wavelength of less than 0.6 µm.

The laser beam preferably has an energy density of 0.1 to 10 ws/cm$^2$.

In the embodiment described so far, it has always been assumed that the laser pulse is a single laser pulse having a defined pulse duration and wavelength and which is generated at the repetition rate specified above.

It is, however, particularly advantageous for the plasma to be formed with a laser pulse part having a wavelength of less than 0.6 µm and a pulse duration in the picosecond range and to be subsequently heated by an additional laser pulse part in the picosecond range. This laser pulse part can have a longer wavelength since the plasma already exists when it strikes the target and so other absorption conditions apply.

In this respect, it is preferable for the additional laser pulse part to follow with a time delay in the range of a few nanoseconds, preferably approximately 0.5 to approximately 5 ns, so that, altogether, the target is not irradiated by a single laser pulse but by a pulse train consisting of two laser pulse parts.

It is even more advantageous for the plasma to be subsequently heated by a plurality of additional laser pulse parts.

These additional laser pulse parts preferably have a wavelength which amounts to an integral multiple of that of the laser pulse part generating the plasma.

The additional laser pulse parts having a longer wavelength preferably follow the laser pulse part which generates the plasma and has a wavelength of less than 0.6 µm at an interval in the range of nanoseconds.

Apart from the inventive process, the object specified at the outset is also accomplished, in accordance with the invention, in an apparatus for producing a functional structure of a semiconductor component which comprises layers arranged on a base substrate and defining the entire functions of the semiconductor component, in that a coating unit is provided, in which lithography-free layer application stations having an exclusively physical operation are provided, the entire functional structure being applied to the base substrate in these stations.

In this respect, it is particularly favourable for at least one laser for applying the layers to be associated with each coating station.

The inventive apparatus also allows a particularly simple and efficient production of the functional structure when the coating unit comprises successive stations in which the functional structure can be produced.

It is then particularly expedient for the individual stations to be arranged such that the functional structure can be produced in a continuous process run.

For this purpose, a transport means extending through the coating unit is preferably provided and the process substrate can be transported thereby from station to station.

Moreover, a plurality of coating stations are preferably provided one after the other in the coating unit and the process substrate is transported successively through them by the transport means.

In addition, it is also advantageous for the structuring of layers to take place in a structuring station following one of the coating stations, in particular when the structuring is done by removing layer material by means of a laser beam.

The remaining features of the inventive apparatus result from the preceding description of the inventive process.

Moreover, it is advantageous in the inventive apparatus for the coating unit to be preceded by a photolytic cleaning unit, in which the base substrate is cleaned and activated.

Additional features and advantages of the invention are the subject matter of the following description as well as the drawings of several embodiments of the inventive solution.

BRIEF DESCRIPTION OF THE DRAWINGS

FIG. 19 is a schematic illustration of a second embodiment of a semiconductor component produced according to a second embodiment of an inventive process.

DETAILED DESCRIPTION OF THE INVENTION

Figure 1:
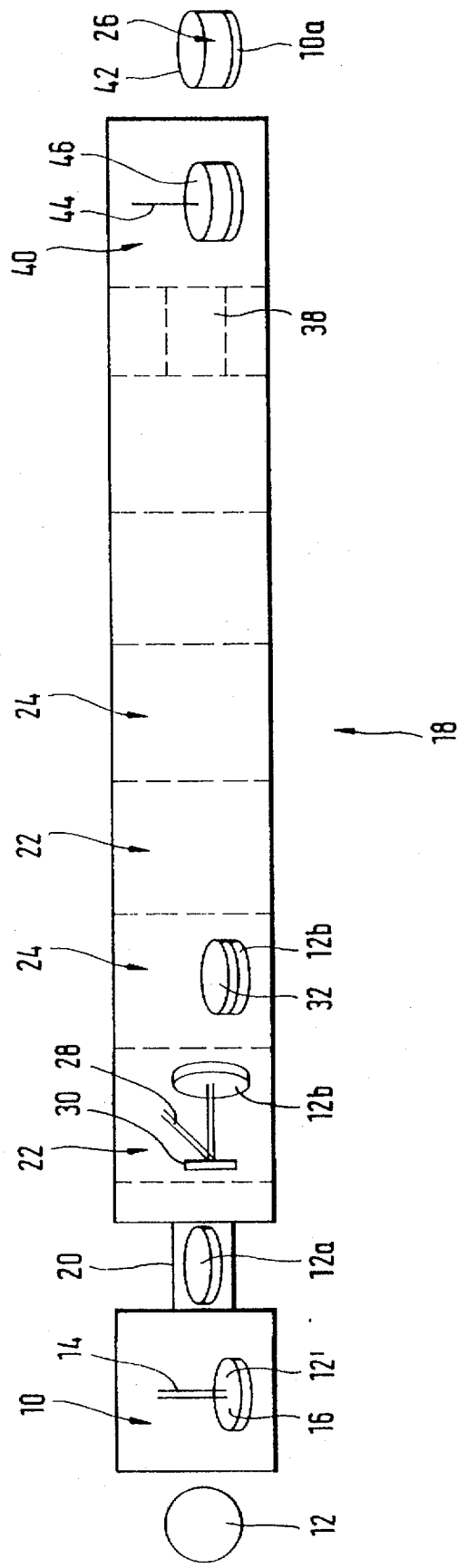
FIG. 1 is a schematic, rough illustration of an inventive apparatus for carrying out an inventive process.

One embodiment of an inventive apparatus for producing a functional structure of a semiconductor component, schematically illustrated in FIG. 1, comprises a photolytic cleaning unit 10 for cleaning a conventionally precleaned, for example, etched substrate 12 which can be introduced into this cleaning unit 10.

In this respect, a layer having a thickness of one or more angstroms is removed from the substrate 12, from a surface 16 to be provided with a functional structure, by means of a laser beam 14 and this substrate is preferably activated on its surface at the same time. This results in a base substrate 12'.

The cleaning unit 10 is followed by a coating unit designated as a whole as 18, into which the substrate 12' cleaned on the surface can be transported, for example, through a closed channel 20 with a lock means.

In the coating unit 18, the functional structure is built up on the base substrate 12a in consecutive coating stations 22 and structuring stations 24. In the schematic illustration in FIG. 1, two coating stations 22 and two structuring stations 24 are illustrated, whereby one of the structuring stations 24 follows one of the coating stations 22 each time. The number of the coating stations 22 and structuring stations 24 provided in the respective coating unit 18 as well as their order and arrangement relative to one another is, however, determined according to the respective functional structure 26 to be applied to the base substrate 12a, in particular according to the number of structured and unstructured layers.

In each of the coating stations 22, an uppermost layer 32 is applied to a process substrate 12b by means of a laser beam 28 due to generation of plasma at a target 30 or at a plurality of targets 30.

For producing structured layers by means of a laser beam 34, at least an uppermost layer or also underlying layers 32 are structured in each of the structuring stations 24, i.e. a defined removal of material takes place in order to divide the layer 32 into defined structures.

The functional structure 26 resulting therefrom comprises layers 32 which are both built up and structured in a defined manner, whereby at least the uppermost layer is normally a metal layer 42.

The substrate 12a provided with the functional structure 26 is therefore fed to a last coating process via a lock means 38 of a metallizing station 40, in which a metallization 42 is applied by means of a laser beam 44 to the process substrate 12b which has passed through the previous process steps as uppermost layer of the functional structure 26. In the case of a structured coating, the metallization 42 is applied by bombardment of a metal film by the laser beam 44 and application of local areas of the metal foil to the functional structure 26 by way of local plasma generation by means of the laser beam 44.

It is, however, also possible to apply the metallization 42 as a continuous metal layer. In this case, which is not shown in the illustration of FIG. 1, a continuous metal layer is applied by means of the laser beam 44 in the same manner as in the preceding coating station.

Construction and function of the individual units 10 and 18 of the inventive apparatus for producing the functional structure 26 of a semiconductor component are described in detail in the following.

Figure 2:
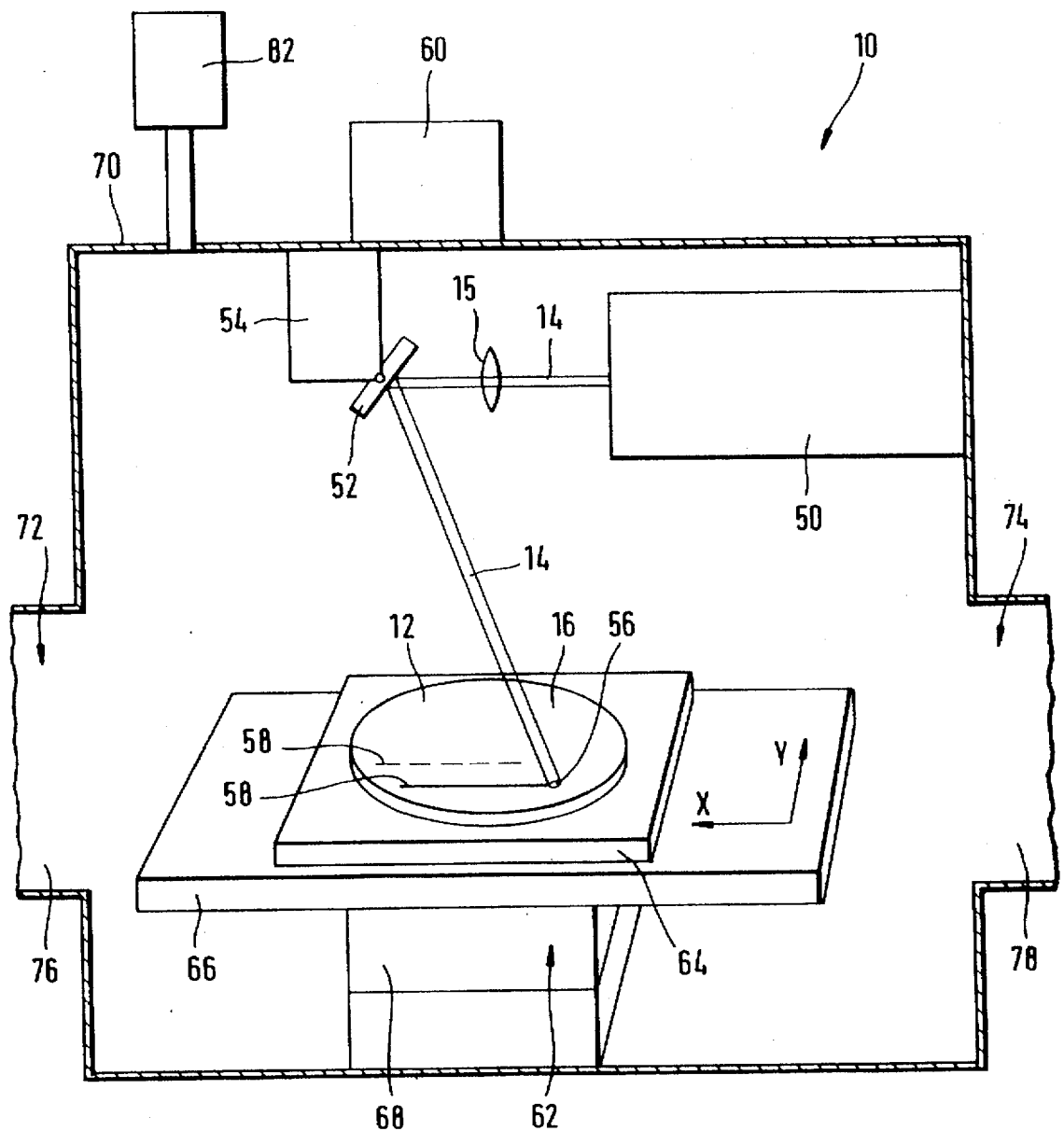
FIG. 2 is a detailed illustration of a photolytic cleaning unit.

One embodiment of an inventive cleaning unit 10 illustrated in FIG. 2 comprises a laser 50 which generates the laser beam 14 focused onto the substrate by means of a focusing element 15. The laser beam preferably has a wavelength of less than 400 nm and also preferably operates with power densities of approximately $10^7$ w/cm$^2$ or more.

The laser beam 14 coming from the laser 50 is preferably reflected onto the substrate 12 by a deflecting mirror 52, which can be driven by a deflection drive 54, such that a focal spot 56 having the power density of approximately $10^7$ w/cm$^2$ results on the substrate.

This focal spot 56 is, according to the invention, moved over the surface 16 of the substrate 12 so as to cover the entire surface, whereby the focal spot 56 is moved, for example, on paths 58 extending parallel to one another. This movement along paths 58 parallel to one another results from activation of the deflecting mirror 52 by means of a control 60 which controls the drive 54 accordingly.

A positioning of the substrate 12 also takes place by means of a positioning table designated as a whole as 62 which has a substrate carrier 64 displaceable preferably in X and Y directions. This substrate carrier is held on a guide 66 and can be driven by a displacement drive 68.

The plane of displaceability of the substrate carrier 64, defined by the X and Y directions, is preferably parallel to the surface 16 of the substrate 12.

Alternatively to a movement of the laser beam 14, it is also possible to move the focal spot 56 on the paths 58 parallel to one another merely by displacing the substrate 12 relative to the laser beam 14 by means of the positioning table 62 so that no variable deflection by way of the deflecting mirror 62 is required.

The positioning table 62 is preferably designed as a displaceable table customarily found in semiconductor technology, which can also be activated via the control 60 so that the positioning of the substrate 12 and the movement of the focal spot 56 on the surface 16 to cover its entire area can be controlled as a whole by way of the control 60.

As already mentioned at the outset, the action of the laser beam 14 causes a removal of a layer having an approximately angstrom to nm thickness while at the same time activating the understructure, i.e. the cleaned substrate 12' by the laser beam 14.

The photolytic cleaning unit 10 comprises, in addition, a closed housing 70 with an inlet opening 72 and an outlet opening 74. A lock means 76 is preferably arranged at the inlet opening 72 and a lock means 78 at the outlet opening so that the substrate 12 can be brought in and out without any significant change in the conditions in the housing 70.

The housing 70 is preferably evacuated to form a high vacuum by means of a high vacuum pump 82 so that the required cleanliness conditions for generating the photolytically cleaned substrate 12' are given.

Figure 3:
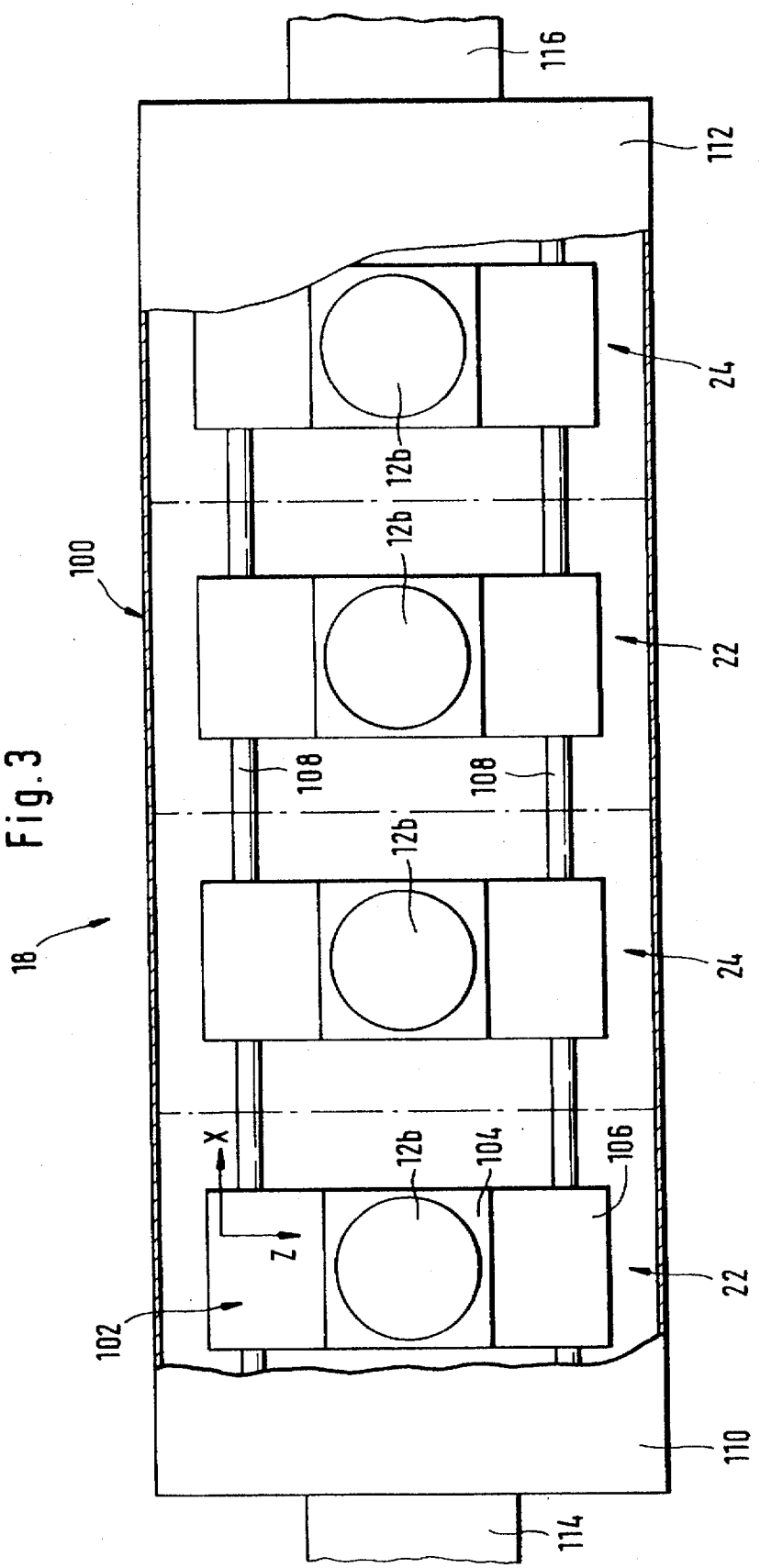
FIG. 3 is a schematic illustration of a coating unit.

The construction unit for the functional structure, designated as a whole as 18 in FIG. 3, preferably comprises a common housing 100, in which the coating stations 22 and the structuring stations 24 and the metallizing station 40 are arranged.

The substrates 12a, which come from the cleaning unit 10 and are photolytically cleaned on their surfaces, are for their part held on positioning tables 102, the substrate holders 104 of which are movable in an XZ plane, whereby the XZ plane is, for example, a plane extending vertically. The positioning tables 102 are also provided, for their part, with base units 106 which, on the one hand, guide the substrate holder 104 in the ZX plane and, on the other hand, have a drive for the positioning of the substrate holder 104 in the XZ plane.

The base units 106 are, for their part, again displaceable on guideways 108 in the housing 100 so that each base unit 106 is movable from a coating station 22 to the following structuring station 24 and then again to the following coating station 22 and can be positioned in a defined manner in the respective station. For this purpose, a drive also not shown in the drawings with a positioning unit is provided.

At a beginning 110 and an end 112 of the housing lock means 114 and 116, respectively, are also provided. These serve to introduce the substrate 12a cleaned in the cleaning unit into the housing 100 and to transport the substrate 12' provided with the functional structure 26 out of the housing 100 without altering the ambient conditions within the housing 100 in the coating stations 22 and the structuring stations 24.

The coating stations 22 and the structuring stations are, preferably, spatially separated from one another by screening. It is, however, even more advantageous for lock means to be arranged between them.

Figure 4:
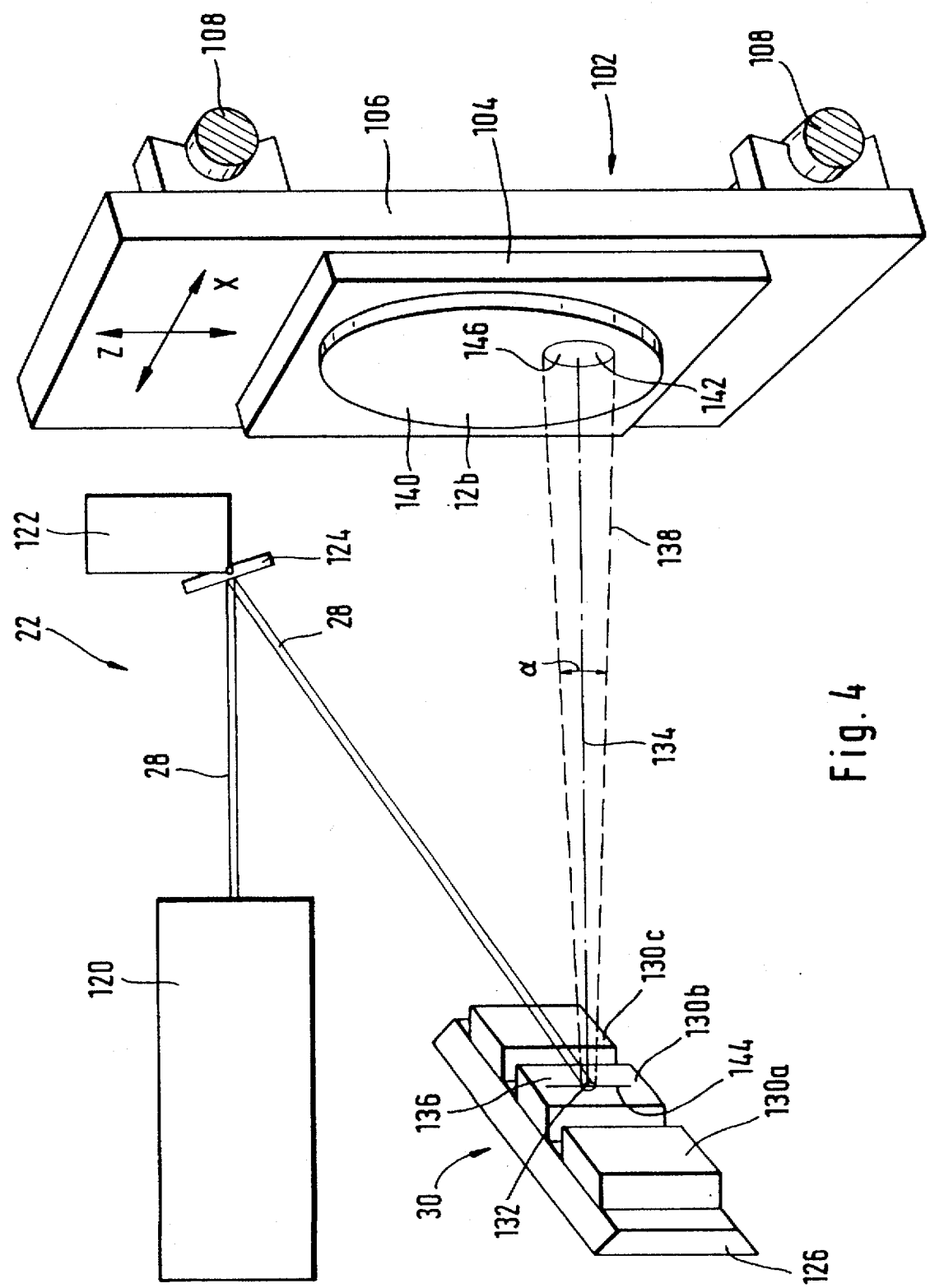
FIG. 4 is an illustration of a coating station.

A laser 120 is associated with each of the coating stations 22, as illustrated in FIG. 4. This laser generates the laser beam 28 which is reflected onto the target 30 by a deflecting mirror 124 activatable via a drive 122.

As illustrated in FIG. 4, this target 30 is, for example, composed of three individual targets 130a, 130b and 130c seated on a target carrier 126, whereby each one of them can be irradiated, for example, at any time by the laser beam 28.

If, as illustrated in FIG. 4, the individual target 130b is irradiated in the region of a radiation spot 132, the target material will expand preferably in the direction of a vertical line 134 to a target surface 136 in the form of a cone 138 symmetrical to this vertical line 134, the cone hereby having, for example, an aperture angle a of approximately 60°. This cone intersects a surface 140 of the process substrate 12b or the respective outermost layer thereof with a coating spot 142, in the region of which the target material is applied to the surface 140 through the cone 138.

In order to achieve a uniform removal of target material, for example, from the individual target 130b with the laser beam 28, the radiation spot 132 is movable on the target surface 136, for example, along a line 144 and preferably transversely thereto, as well. This can be achieved by the deflecting mirror 124 deflecting the laser beam 28 such that the radiation spot 132 migrates relative to the target carrier 126 along the line 144 and, where necessary, transversely to it.

Therefore, the cone 138, and with it the coating spot 142, also migrates to a slight extent on the surface 140 but the distance is not normally sufficient to achieve a full surface coating of the surface 140.

For this reason, the substrate holder 104 is preferably movable, in addition, in the XZ plane relative to the base unit 106 so that the coating spot 142 migrates over the entire surface 140.

Alternatively, it is also possible to move the target carrier 126 by means of a displacing and positioning unit such that when the substrate 12' is stationary or the surface 140 is stationary the cone 138 and the coating spot 142 migrate over the entire surface 140, with corresponding following guidance of the laser beam 28 by means of the deflecting mirror 124. In this respect, the relative movement of the radiation spot 132 on the target surface 136 relative to the individual target 130b is also to be taken into consideration during the following guidance.

As laser, a laser can preferably be considered, which has a wavelength of less than 0.6 µm and pulse durations Tp in the order of 1 to 100 picoseconds.

The power density in the radiation spot 132 is preferably at $10^9$ to $10^{12}$ w/cm$^2$.

The single pulses P have a pulse sequence which is approximately in the 10 kHz range. In accordance with the invention, approximately one or a few atom layers of the respective target material are applied per single pulse P in the coating spot 142.

Figure 5:
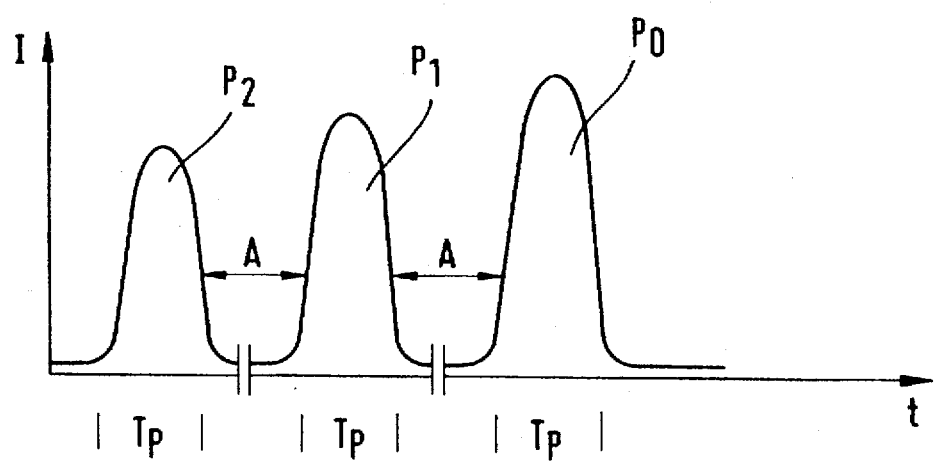
FIG. 5 is an illustration of an inventive pulse train.

In a preferred embodiment, illustrated in FIG. 5, the pulse $P_0$ having the wavelength of less than 500 nm is followed by additional sequence pulses $P_1$ and $P_2$ at time intervals of approximately 0.5 to approximately 5 nanoseconds, whereby these pulses also have a pulse duration Tp which is in the range of 1 to 100 picoseconds.

These pulses $P_1$ and $P_2$ are preferably pulses having different wavelengths, for example double and four times the wavelength of the pulse $P_0$.

These pulses $P_1$ and $P_2$ having a longer wavelength result in a subsequent acceleration of the stream of particles already generated by a plasma on the target surface 136, in particular in a homogenization of the particle energy by subsequent heating of the rearward, slower regions of the stream of particles facing the target. This means that this stream of particles expands on the surface 140 of the substrate 12' more uniformly and more effectively in the direction of the coating spot 142.

The most varied materials can preferably be considered as target materials. For example, it is conceivable for the application of a semiconductor layer to the surface 140 to use as target 30 a target consisting of this semiconductor material. However, when using a compound semiconductor it is conceivable to use the individual targets, for example the individual targets 130a, 130b and 130c and to select these from the individual elements of the compound semiconductor and, for example, an additional individual target with a doping.

If, for example, a layer consisting of GaAlAs is intended to be applied to the surface 140, it would, for example, be possible to use Ga as target 130a, Al as target 130b and As as target 130c. In order to achieve stoichiometric ratios, the laser beam 28 with its radiation spot 132 changes after each single pulse P or following a series of pulses P from the individual target 130a to the individual target 130b and again to the individual target 130c. Alternatively, it would also be possible to use an individual target 130a in the form of GaAs and an individual target 130b in the form of AlAs and likewise change with the radiation spot 132 from the individual target 130a to the individual target 130b after each single pulse or following a series of single pulses, whereby the radiation results in accordance with the stoichiometric ratios. A correspondingly suitable doping material could then be used as individual target 130c, whereby altogether the number of pulses P striking the doping material is less than that for the application of the semiconductor material.

The application of layers consisting of compound semiconductor materials using individual targets with either individual elements of the compound semiconductors or, again, individual compounds of the compound semiconductors, which comprise, in any case, the compound semiconductor in the stoichiometric ratio, is possible since a maximum of one atom layer and therefore, a part layer 146 is applied in the coating spot 142 per laser pulse P. This means that it is possible to generate optional stoichiometric ratios by superposing part layers 146 and the stoichiometric ratios in the layer building up can be adjusted directly in the coating spot 142 by corresponding changeover between the individual targets 130a, 130b and 130c or additional individual targets.

Moreover, it has to be considered that the semiconductor layers to be applied are, altogether, in the order of several 100 nm. Consequently, in the order of 1,000 pulses P and, therefore, a corresponding number of part layers 146, are already required during the application of a layer 100 nm thick in the non-moving coating spot 142. If consideration is also given to the fact that the coating spot 142 is only a fraction of the surface 140, to which a semiconductor layer is intended to be applied, this results in the fact that in the order of more than 10,000 pulses P are required for the application of this layer which means that homogeneous stoichiometric mixtures can also be achieved in this semiconductor layer in a simple manner.

This also results in the fact that the thickness of the layer to be applied to the surface 140 can, on the one hand, be achieved in a simple manner and homogeneously due to the relative movement between the cone 138 and the substrate 12' from pulse P to pulse P and that, in addition, the layer thickness can be determined by the number of pulses P and, therefore, the length of the coating procedure.

Figure 6:
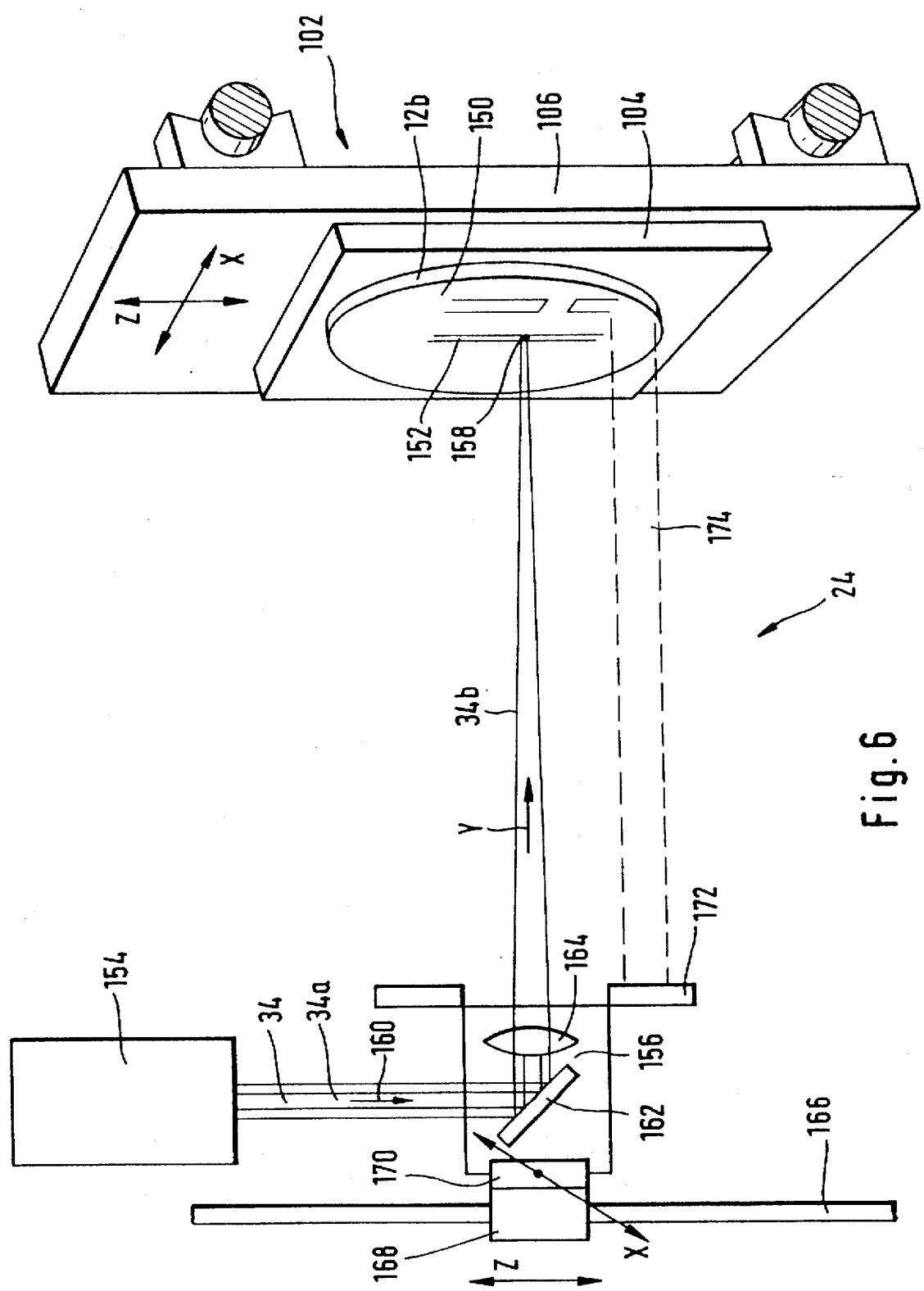
FIG. 6 is an illustration of a first embodiment of a structuring station for the removal of layer material.

In the structuring station 24 illustrated as a whole, by way of example, in FIG. 6, the substrate 12b provided with a semiconductor layer 150 is also seated on the substrate holder 104, which, for its part, is held on the base unit 106 of the positioning table 102 so as to be displaceable in X and Z directions.

For the subsequent structuring of the layer 150, for example for removing its material along a strip 152, the laser beam 34 generated by a laser 154 is focused onto the strip 152 via an optical focusing means 156, namely such that a focus 158 is located exactly in the strip 152 and, therefore, removes the material of the layer 150 in this strip.

The laser 154 is preferably arranged such that a laser beam 34a exiting therefrom expands with its longitudinal direction 160 parallel to the Z direction and is deflected by a deflecting mirror 162 in the optical focusing means in Y direction, i.e. at right angles to the X and Z directions, and thereby passes through a lens 164 of the optical focusing means 156 which focuses this beam as laser beam 34b onto the focus 158. The layer 150 preferably extends in a plane parallel to the XZ direction.

In order to move the focus 158 relative to the layer 150 so that, for example, material of the layer 150 can be removed in the strip 152, the substrate holder 104 is movable in the known manner relative to the base unit 106 and positionable in the XZ direction.

Moreover, the optical focusing means 156 can also be advantageously moved in the Z direction, namely guided by a guide element 168 on a longitudinal guide 166 which is preferably designed as a portal guide, so that a focusing onto the focus 158 on the layer 150 always takes place irrespective of the position of the optical focusing means 156 relative to the laser 154.

Furthermore, the optical focusing means 156 is movable transversely to the Z direction, i.e. in X direction relative to the guide element 168, by means of an additional guide element 170, whereby the guide element 170 represents a longitudinal guide of the optical focusing means 156 in X direction.

It is, therefore, possible to bring about the relative movement between the laser beam 34 and the layer 150 by moving the optical focusing means 156 in the Z direction and, therefore, moving the focus 158 in the same direction without displacing the substrate holder 104. This is particularly advantageous for the removal of material over large areas without such a high degree of precision. However, as soon as a fine structuring is required, the optical focusing means 156 is preferably held constant and a relative movement is carried out by means of the substrate holder 104 relative to the base unit 106 which is normally possible at lower displacement speeds.

The structuring station 24 expediently operates in a high vacuum. In order to prevent the material removed from the layer 150 being deposited on the lens 164 and soiling it, a particle intercepting shield 172 is preferably provided around the optical focusing means. An electrical field 174 extends from this shield as far as the layer 150. The electrical field serves to deflect plasma generated in the focus 158 in the direction of the particle intercepting shield 172 and, therefore, to prevent this expanding in the direction of the lens 164. In this case, the structuring takes place such that a plasma with charged particles always results in the focus 158.

A laser having pulse durations between 1 and 100 picoseconds and wavelengths of 0.2 to 0.5 μm is used as laser.

The light density in the focus 158 is preferably $10^8$ to $10^{10}$ w/cm$^2$.

Figure 7:
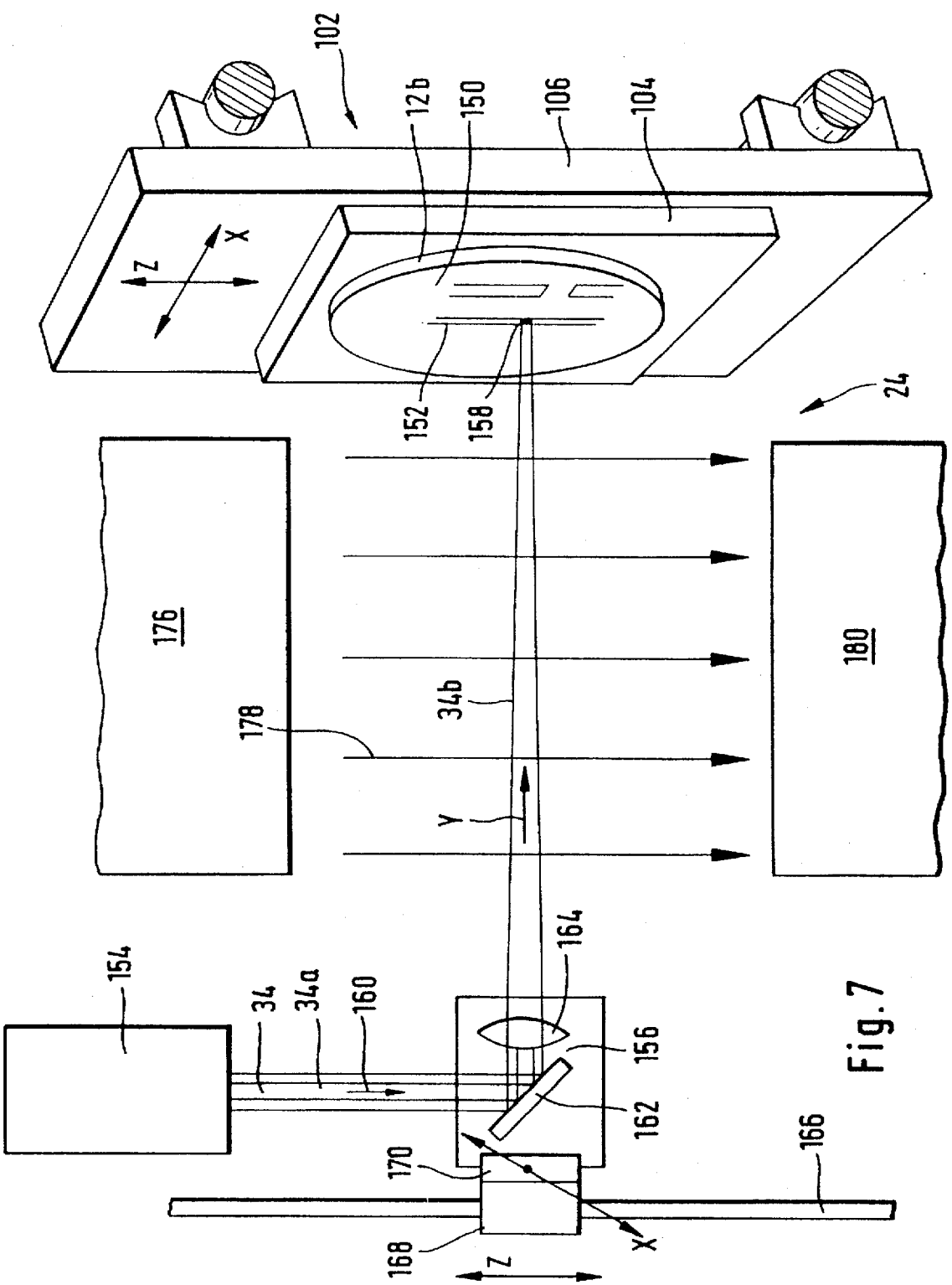
FIG. 7 is an illustration of a second embodiment of a structuring station for the removal of layer material.

In an alternative solution to the embodiment illustrated in FIG. 6 and described in the above, illustrated in FIG. 7, the structuring does not take place in a high vacuum but in a protective gas atmosphere. A stream of gas 178 is generated by way of a gas inlet 176 and this stream of gas penetrates transversely through the laser beam 34b and therefore transports the particles removed in the focus 158 to a protective gas outlet 180 in which the particles are deposited. It is, therefore, likewise possible, with this stream of protective gas, to protect the optical focusing means 156 from becoming soiled by the material removed from the layer 150.

If the metallization 42 is applied in the metallizing station 40 in the form of a continuous layer, this is carried out with an apparatus corresponding to the apparatus described in conjunction with the coating station in FIG. 4, whereby the target 30 comprises the coating material as material, i.e. the corresponding metal. As for the rest, this apparatus is identical to that illustrated in FIG. 4.

If, on the other hand, a structuring metallization takes place in the form of individual metal webs in the metallizing station 40, a coating apparatus 210 constructed in the following manner is provided for structured layers. An apparatus of this type is also suitable for one of the coating stations 22 when a structured layer is intended to be applied and so the following structuring station can be omitted.

Figure 8:
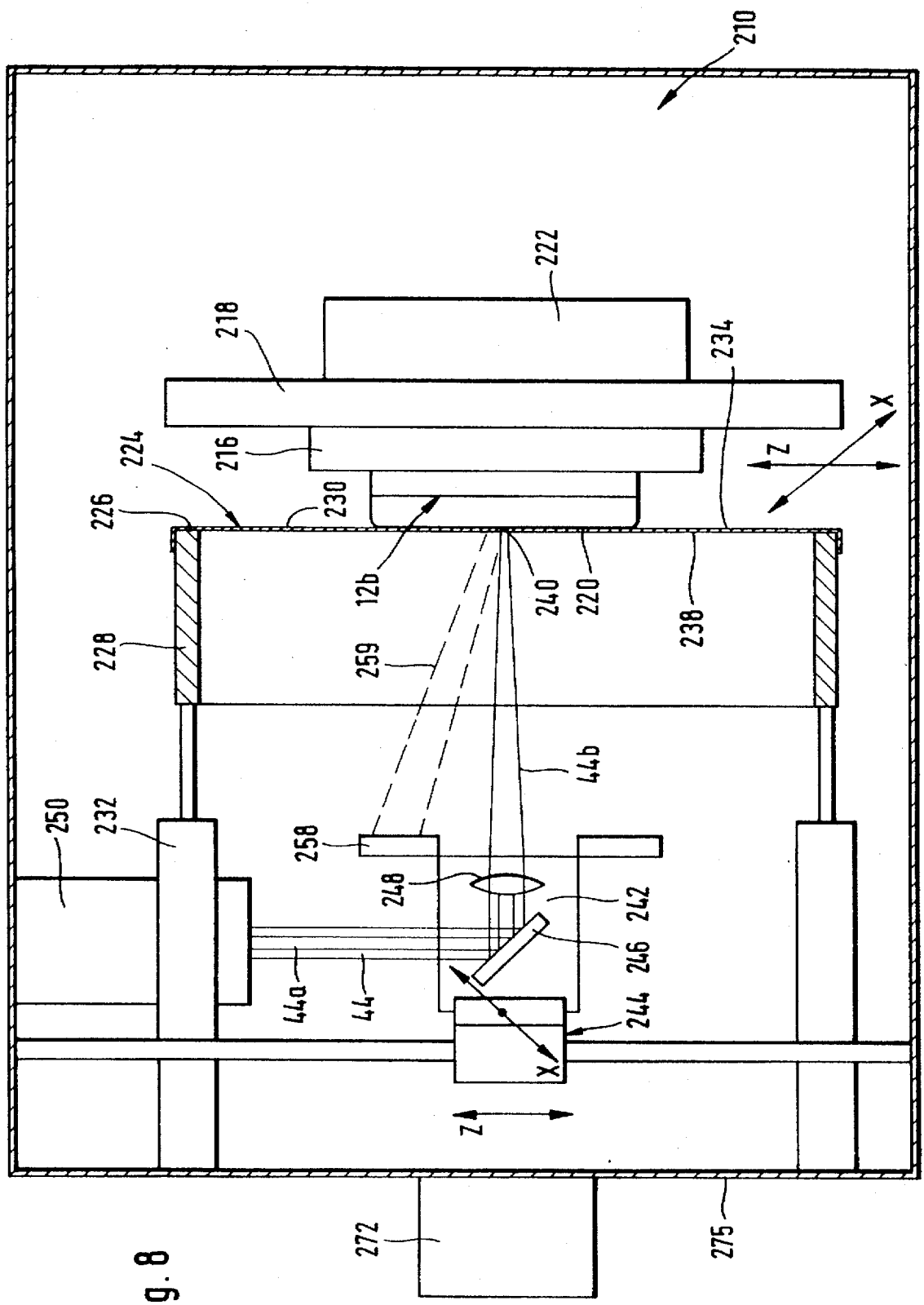
FIG. 8 is an illustration of a first embodiment of a coating station for the application of structured layers.

As illustrated in FIG. 8, the process substrate 12b with the applied layers is held on a substrate carrier 216 which, for its part, is displaceable on a base unit 218 in an X and a Z direction, whereby a surface 220 of the functional structure 26 extends parallel to the XZ plane. The substrate carrier 216 and the base unit 218 are preferably identical to the substrate holder 104 and the base unit 106.

The base unit 218 has, for this purpose, a drive 222, with which the process substrate 12b, together with its functional structure, can be positioned exactly in the XZ plane. A metal foil 224 forming a material film can be placed on the surface 220 and the material of this foil is intended to be metallizable onto the surface 220 in a structured manner, i.e., for example, in strips or in a meandering shape.

This metal foil 224 preferably has a thickness of less than 5 micrometers.

In addition, this foil 224 is fixed in position, for example, at an outer edge 226 of a retainer ring 228 and with a free region 230 is tensioned without support within the outer edge 226 extending all around it. This free region can be placed onto the surface 220. In addition, the retainer ring 228 can be moved towards or away from the surface 220 by an adjusting means 232 so that after positioning of the process substrate 12b the entire foil 224 can be positioned, due to movement of the retainer ring 228 by the adjusting means 232 towards the surface 220, at a distance of, for example, a few μm from the surface 220 or be placed directly on this surface with its front side 234.

Figure 9:
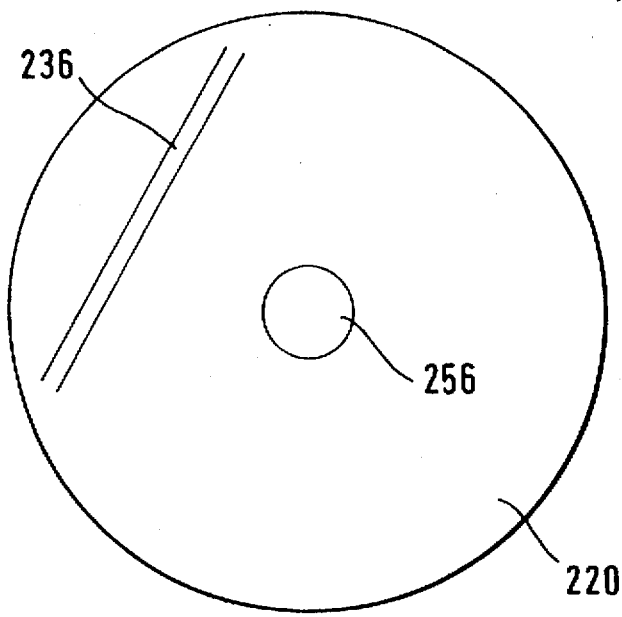
FIG. 9 is a schematic illustration of a structured layer.

If the foil 224 is positioned with its front side 234 relative to the surface 220 of the functional structure 26 as illustrated, a strip 236 illustrated in FIG. 9 is, for example, metallized onto the surface 220 by irradiation of a rear side 238 of the foil 224 by means of the laser beam 44. In this respect, the laser beam 44 is focused with a section 44b onto a focus 240 on the rear side 238 of the foil 224. For this purpose, an optical focusing means 242 is provided which, for its part, is also positionable in an XZ plane by means of a double carriage system 244. This optical focusing means 242 comprises a deflecting mirror 246 for a section 44a of the laser beam 44 incoming parallel to the XY plane as well as a lens 248 arranged after the mirror which focuses the section 44b of the laser beam 44 onto the focus 240. The laser beam 44 is preferably generated by a schematically illustrated laser 250.

Figure 10:
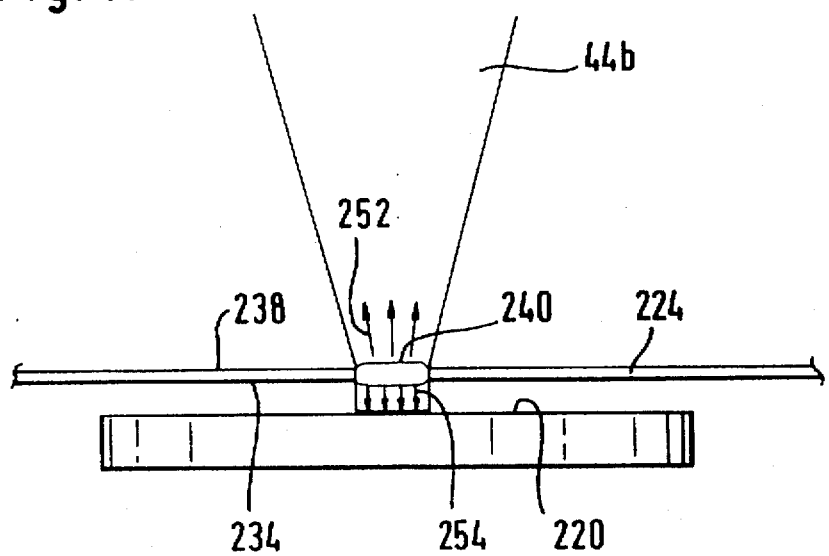
FIG. 10 is an enlarged illustration of a detail showing relations in the region of a focus in FIG. 8.

The surface 220 is now metallized in that a plasma is generated in the focus 240 from the material of the foil 224, the plasma particles of which move, on the one hand, along the arrows 252 in the direction towards the optical imaging means 242 (FIG. 10), these preferably being particles from the material of the foil 224 located on the rear side 238.

This automatically leads to material or particles located on the front side 234 of the foil 224 being accelerated in the direction of arrows 254 by a pressure surge resulting during the plasma generation, thereby striking the surface 220 of the process substrate and being fixed in position on this surface.

As a result of movement of the focus 240 relative to the foil 224, optional strips 236 or even round metallized areas 256 can be produced on the surface 220, whereby it is also possible to produce more complicated structures, for example complicated path conductor structures, on the surface 220.

Figure 11:
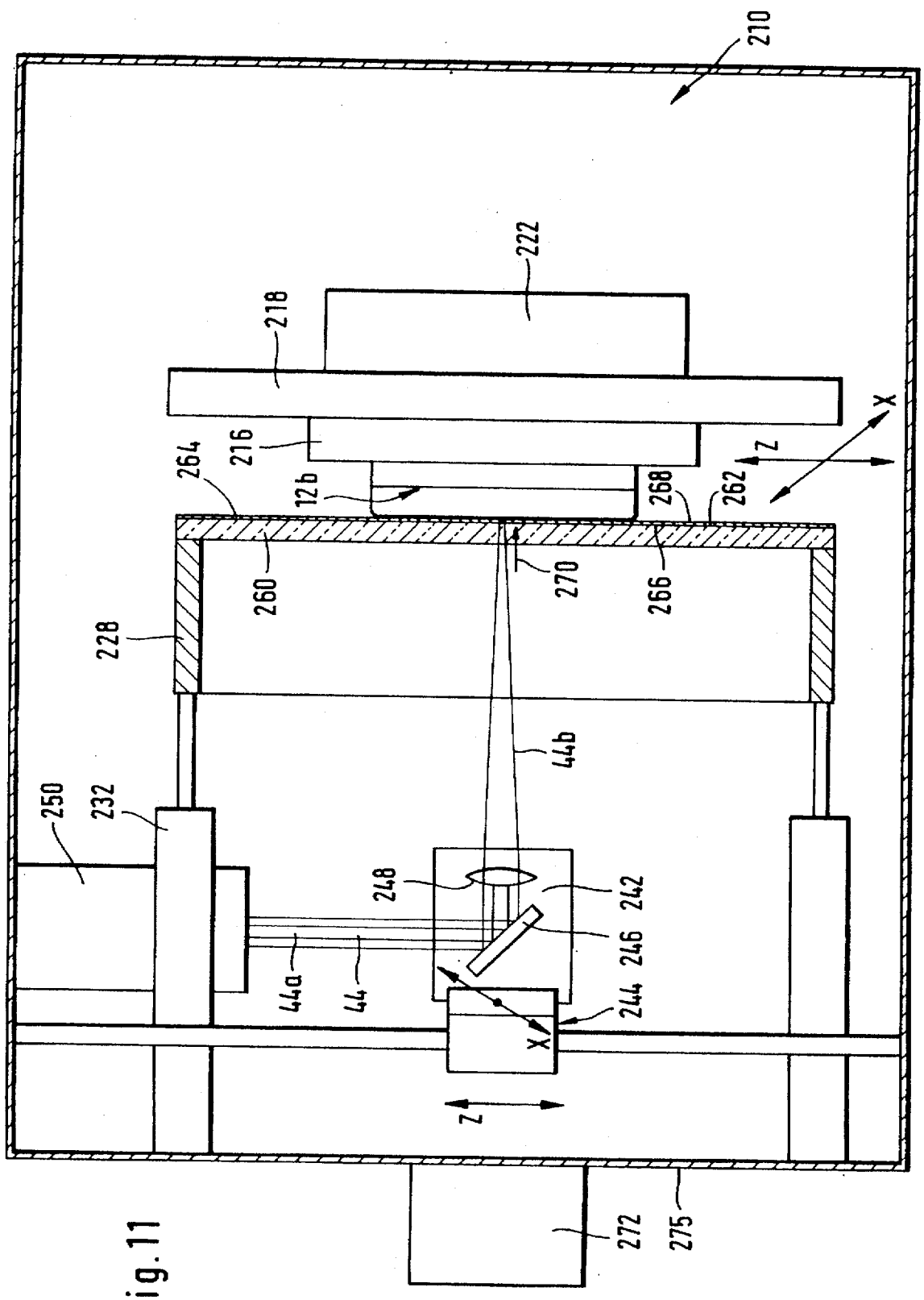
FIG. 11 is an illustration of a second embodiment for the application of a structured layer.

In a second embodiment of the inventive coating apparatus 210, illustrated in FIG. 11, the foil 224 is replaced by a transparent plate 260, to the front side of which, i.e. the side facing the surface 220, a metal film 264 is applied, i.e., for example, vapor-deposited, as material film. This film has a thickness in the order of an absorption depth of the laser radiation in this metal film 264. This thickness is, in particular, less than 0.12 μm, preferably 20 nm or less.

The transparent plate 260 is supported by the retainer ring 228 in the same way and movable by the adjusting means 232 in the same way as the foil 224 relative to the surface 220. The laser beam 44b is thereby focused onto a rear side 266 of the metal film 264, i.e. the side resting on the transparent plate 260, and when striking this side generates a plasma from the material of the metal film 264 so that parts of the material of the metal film 264, in particular on a front side 268 thereof, are accelerated onto the surface 220 in the direction of the arrow 270, strike this surface and are thereby fixed in position.

The advantage of this embodiment is to be seen in the fact that this allows the metal film to be thinner than the foil 224, for example so thin that the plasma extends through the thickness of the metal film 264 so that particles from the plasma are deposited on the surface 220 and form a part layer which is in the range of a few nm so that several part layers are to be placed on top of one another to build up a greater layer thickness.

Furthermore, especially for the application of thicker metallizations, several metallizing layers are applied on top of one another, i.e., for example, a first part layer is applied, then the transparent plate 260 with the metal film 264 displaced to such an extent that a second and, where necessary, a third part layer can be applied.

In order to utilize the entire surface of the foil 224 or the metal film 264 for the metallization, the laser beam 44b is displaceable due to displacement of the optical focusing means 242 essentially over the entire inner region of the retainer ring 228. Furthermore, the process substrate 12b with the functional structure 26 is also displaceable so that successive increasing areas of the foil 224 or of the metal film 264 can be used for metallizing the surface 220. This leads to a utilization of the free region 230 of the foil 224 or the metal film 264 which is as effective as possible.

For this purpose, a control 272 is provided which controls both the movement of the laser beam 44b and the relative movement of the substrate 12b with the functional structure 26 and, in particular, memorizes which areas of the foil 224 or the metal film 264 have already been ablated by plasma generation and are, therefore, no longer available for the further structured metallization. This means that use of the material of the foil 224 or of the metal film 264 is as effective as possible.

Figure 12:
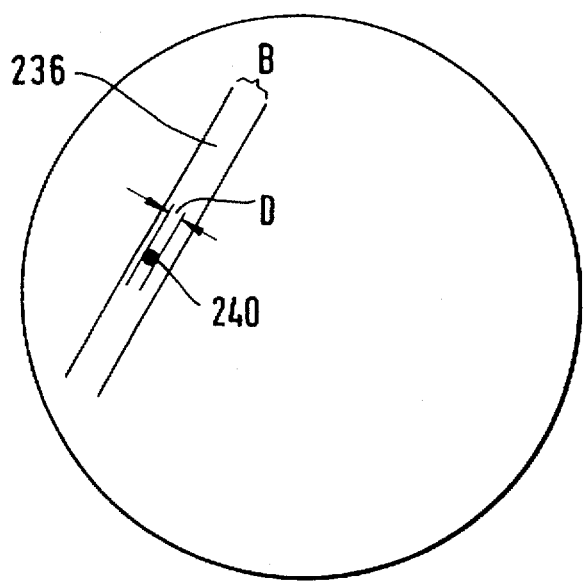
FIG. 12 is a schematic illustration of conditions of the structured layer during application in accordance with the embodiment according to FIG. 11.

As illustrated in FIG. 12, the focus preferably has a diameter D which is smaller than a width B of a structure to be metallized, for example of the strip 236, so that the structure to be applied results from repeated application of the metallization and each time with the diameter D of the focus 240.

Figure 13:
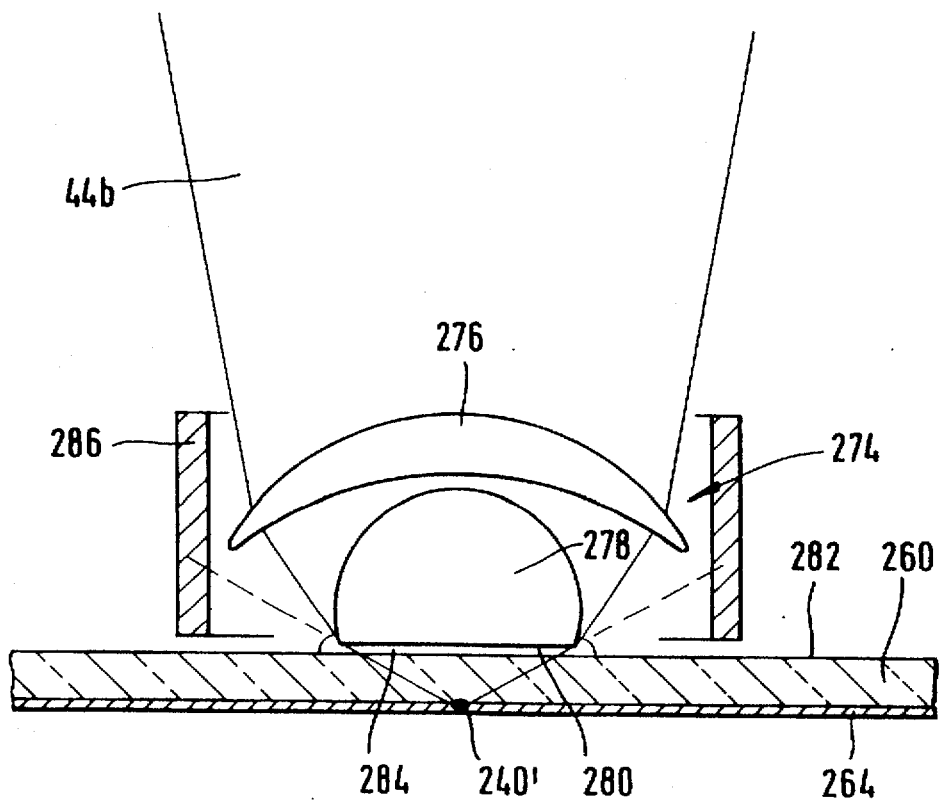
FIG. 13 is an enlarged illustration of a detail in the region of the focus of one variation of the second embodiment according to FIG. 11.

In a variation of the second embodiment, illustrated in FIG. 13, an additional focusing element 274 is arranged on the transparent plate 260. This additional focusing element comprises a first focusing lens 276 and a second focusing lens 278, whereby the second focusing lens rests with a flat underside 280 on a rear side 282 of the transparent plate 260 remote from the metal film 264 and an immersion fluid 284 is arranged between the underside 280 and the rear side 282. The first lens 276 already bundles the laser beam 44b and focuses this onto the second lens 278. Due to the fact that the laser beam, following the second lens, always extends into material having a refraction index greater than 1, an additional focusing takes place onto a focus 240' and this can be smaller than the wavelength of the laser beam. This means that particularly small structures can be produced.

The focusing element 274 is, for its part, held in a housing 286 and also moved with the laser beam 44b, i.e. with the carriage system 244, whereby the second lens 278 floats, so-to-speak, on the immersion fluid 284 when the laser beam 44b moves relative to the transparent plate 260.

As a laser having a pulse duration of 1 to 100 picoseconds is also used, whereby the wavelength is between approximately 0.2 and 1.2 μm and the light density is greater than $10^8$ w/cm$^2$, preferably $10^9$ to a maximum of $10^{10}$ w/cm$^2$ in the region of the focus 240 in the second and third embodiments and in the first embodiment preferably more than $10^{10}$ w/cm$^2$.

The metallization is preferably carried out in all the embodiments in a high vacuum so that the entire arrangement described in the above is arranged in a housing 275 which is accessible via lock means.

In this case, measures must be taken in the first embodiment to prevent any soiling of the optical focusing means 242 by the foil 224. For example, the optical focusing means 42 is also provided with a particle intercepting shield 258 extending around the laser beam 44b. An electrical field 259 is formed between this shield and the foil 224 and the particles move along this electrical field when a plasma is generated so that any soiling, in particular, of the lens 248 is avoided (FIG. 8).

Alternatively, it is conceivable to provide a flow of protective gas penetrating the laser beam 44b, in the same manner as described in conjunction with the structuring station.

These measures are superfluous in the second embodiment described in FIG. 11 since a protection of the optical focusing means 242 is already ensured by the transparent plate.

Figure 14:
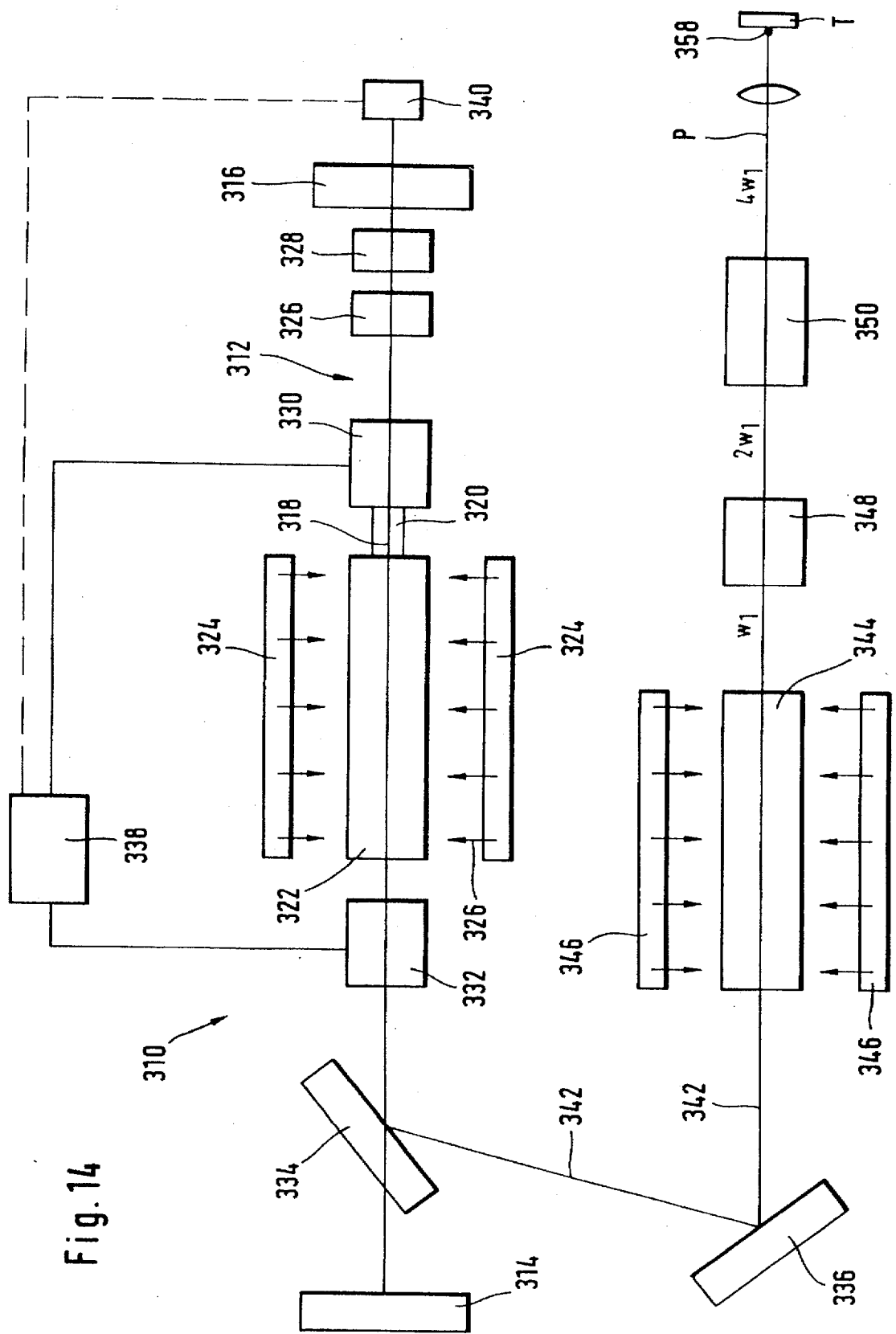
FIG. 14 is a schematic illustration of a first embodiment of an inventive laser system.

One embodiment of a laser system used in accordance with the invention, and designated as a whole in FIG. 14 as 310, comprises a laser resonator 312, which is closed at its ends by two fully reflecting end mirrors 314 and 316. A resonator axis 318 hereby determines the resonator radiation field 320 building up between the end mirrors 314 and 316.

In addition, an oscillator crystal 322 is arranged between the end mirrors and this represents the laser-active medium.

This oscillator crystal 322 is pumped by rows of diodes 324 which act on the oscillator crystal with pumping light along the arrows 326, i.e. transversely to the resonator axis 318. The diodes of these rows 324 are semiconductor diodes, for example made from GaAlAs or InGaAlAs.

Furthermore, two modulators 326 and 328 are arranged in front of the end mirror 316 and these modulators serve the purpose of mode-locking in the resonator radiation field, whereby their transmission is modulated with the frequency of the round-trip time of the laser resonator 312. In addition, a Pockels cell 330 is located between the modulators 326 and 328 and the oscillator crystal 322 and this serves the purpose of Q-switching in the laser resonator in order to control the build-up of the resonator radiation field 320 with a pulse having a half width in the picosecond range.

The components of the inventive laser system 310 described so far represent the components of a laser system known from the prior art for generating laser pulses in the picosecond range by means of mode-locking.

An additional Pockels cell 332 is provided between the oscillator crystal 322 and the end mirror 314 and a polarization-dependent transmission and reflection mirror 334 between the Pockels cell 332 and the end mirror 314. This mirror 334 is arranged such that it allows one polarization direction to pass through to the end mirror 314 while the other polarization direction at right angles thereto is reflected.

When the Pockels cell 332 is not activated, the transmission and 320 reflection mirror 334 allows the resonator radiation field to pass through to the end mirror 314. When the Pockels cell 332 is activated, the polarization plane is rotated in such a manner that the transmission and reflection mirror 334 reflects the laser radiation out of the laser resonator 312 onto a deflecting mirror 336 and therefore couples out the laser pulse P. For this purpose, a control 338 is provided which, on the one hand, activates the Pockels cell 330 such that a laser pulse P can build up in the resonator 312 due to reflection back and forth between the end mirrors 314 and 316. After a specific time, the Pockels cell 332 is activated and this rotates the polarization plane of the laser pulse P such that this is reflected by the transmission and reflection mirror 334 out of the laser resonator 312 and onto the deflecting mirror Alternatively, it is also conceivable, for example, to provide a detector 340 behind the end mirror 316 which is capable of measuring the intensity of the laser pulse P building up in the laser resonator 312 when end mirror 316 is transmitting only slightly. By interrogating this detector 340, it is possible to activate the Pockels cell 332 via the control 338 so that the laser pulse P can always be coupled out by reflection onto the deflecting mirror 336 once this laser pulse exceeds a threshold intensity.

The deflecting mirror 336 further deflects the exiting laser beam 342, namely through an amplifier crystal 344 which is constructed in the same way as the oscillator crystal 322 and is optically pumped by rows of diodes 346. Once the laser pulse P has been amplified in the amplifier crystal 344, a frequency doubling takes place in a doubler crystal 348 from the frequency $w_1$ to the frequency $2 \times w_1$ and a further frequency doubling by a doubler crystal 350 from the frequency $2 \times w_1$ to the frequency $4 \times w_1$.

A frequency doubling of this type is necessary when, as is customarily the case, a neodymium crystal is used as oscillator crystal, for example Nd-YAG or Nd-YLF. A double frequency doubling results in wavelengths in the UV range.

In the simplest case, the inventive laser system is operated with the part of the laser pulse P having the frequency $4 \times w_1$ and the other frequency parts are not used.

Figure 15:
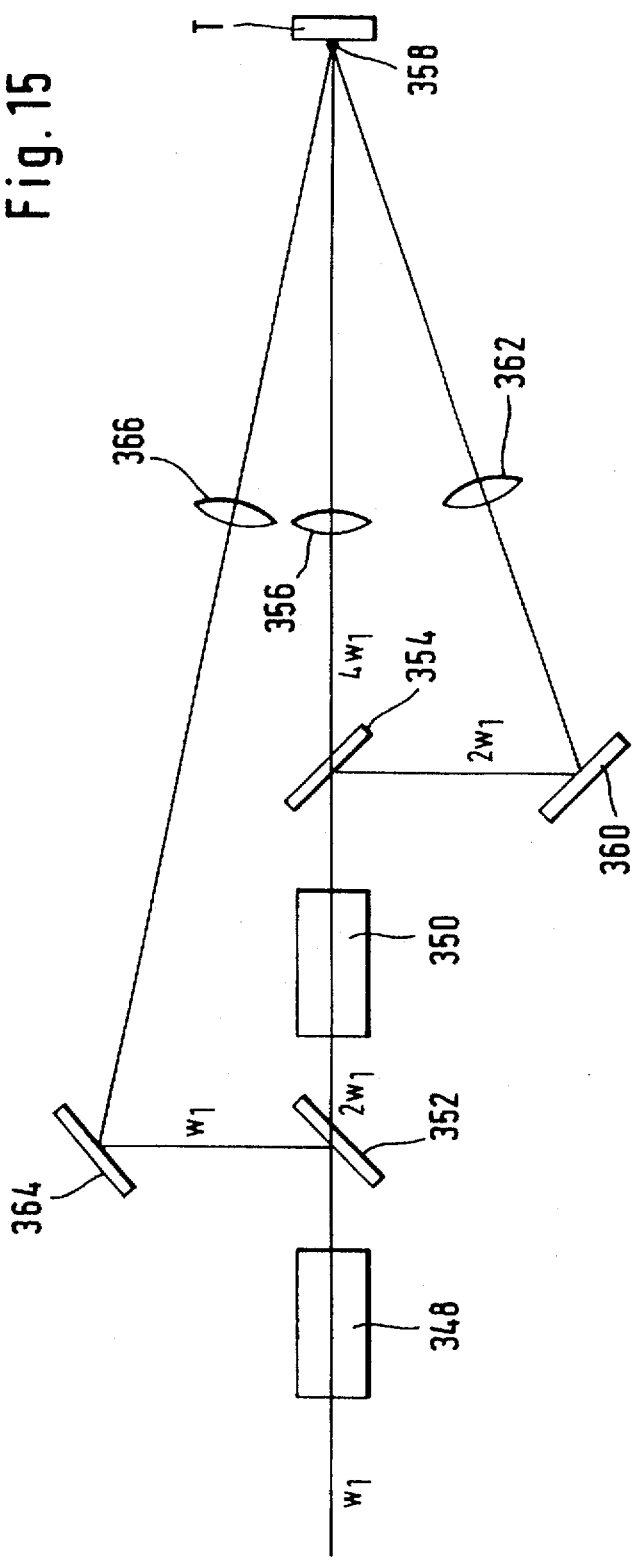
FIG. 15 is an illustration of a detail of a second embodiment of an inventive laser system.
Figure 16:
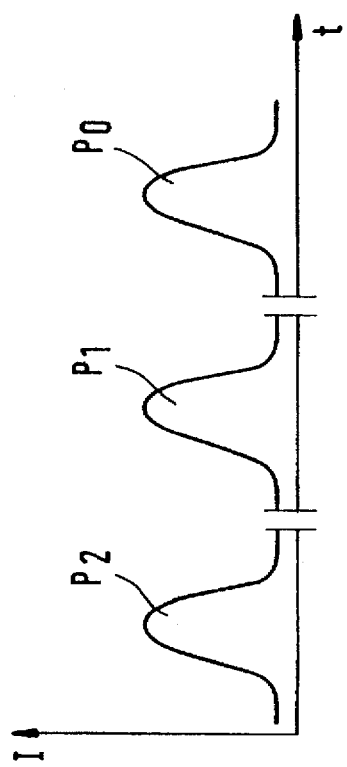
FIG. 16 is a schematic illustration of a pulse train.

However, a second embodiment of the inventive laser system, illustrated in FIG. 15, is particularly advantageous. In this embodiment, the part $Tw_1$ of the laser pulse having the frequency $w_1$ is masked out following the first doubler crystal 348 by means of a wavelength-selective reflection element 352, whereas the part $T2w_1$ of the laser pulse having the frequency $2 \times w_1$ enters the second doubler crystal 350 and is partially doubled to the frequency $4 \times w_1$. The portion $2 \times w_1$ is likewise coupled out by a further wavelength-selective reflection element 354 following the second doubler crystal 350 so that the laser pulse is divided into its individual laser pulse parts having the different frequencies. The laser pulse part $P_0$ with the frequency $4 \times w_1$ is focused directly onto a focus 358 by means of a lens 356, the laser pulse part $P_1$ of the laser pulse P with the frequency $2 \times w_1$ is deflected by a further deflecting element 360 and likewise focused onto the focus 358 by means of a lens 362 but with a time delay caused by extension of the optical path length. As a result, the laser pulse part $P_0$ arrives in the focus first and then, with a time delay, the laser pulse part $P_1$ with the frequency $2 \times w_1$ of the laser pulse. The laser pulse part $P_2$ with the frequency $w_1$ is also deflected by a deflecting element 364 and focused onto the focus 358 by means of a lens 366, whereby an additional extension of the optical path length relative to the laser pulse part $P_1$ is generated so that the laser pulse part $P_2$ again arrives at the focus 358 with a time delay in relation to the pulse $P_1$ (FIG. 16).

As for the rest, the second embodiment is designed in the same way as the first embodiment and so reference is made to the entire subject matter of this first embodiment.

Figure 17:
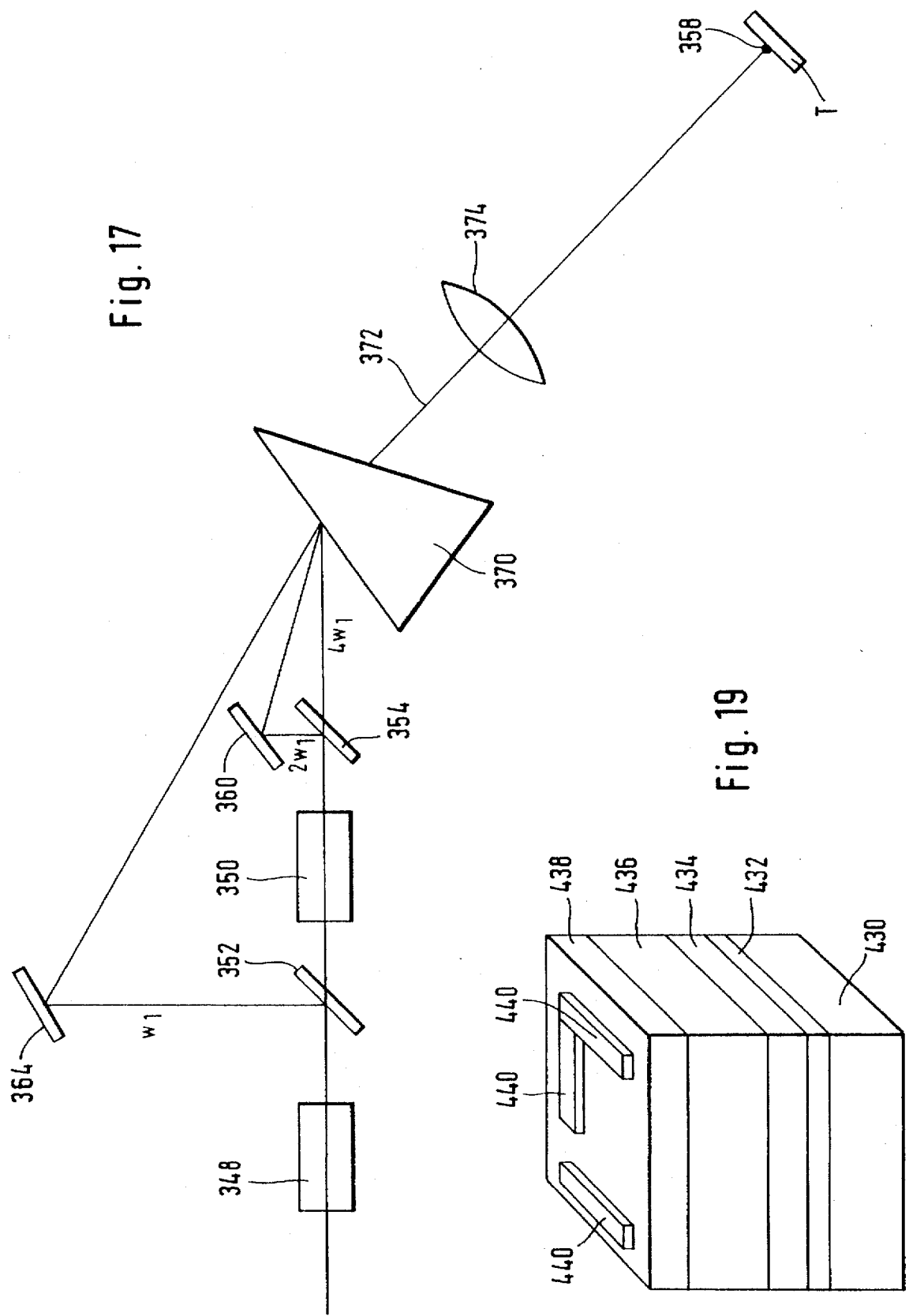
FIG. 17 is a schematic illustration of a detail of a third embodiment of an inventive laser system.

In a third embodiment of an inventive laser system, illustrated in FIG. 17, the frequency parts $w_1$ are also coupled out following the first doubler crystal 348 and the frequency parts $2 \times w_1$ following the second doubler crystal 350 by means of the wavelength-selective reflection elements 352 and 354.

At the same time, the laser pulse part $P_1$ is delayed in relation to the laser pulse part $P_0$ and the laser pulse part $P_2$ in relation to the laser pulse part $P_1$, likewise by corresponding extension of the optical path length.

On the other hand, all the laser pulse parts are again combined by means of a prism 370 in one direction 372 and focused onto the focus by means of a common lens 374 so that the pulses $P_0$, $P_1$ and $P_2$ extend colinearly to one another and strike the focus 358.

As for the rest, the third embodiment is designed in the same way as the first embodiment and so reference is made to the entire subject matter of this first embodiment.

A laser system of this type can be used in all the inventive coating stations and structuring stations.

Two embodiments will now be used to explain in a simplified manner how the inventive process is carried out.

The first embodiment provides for the production of a semiconductor laser from III–V material.

Figure 18:
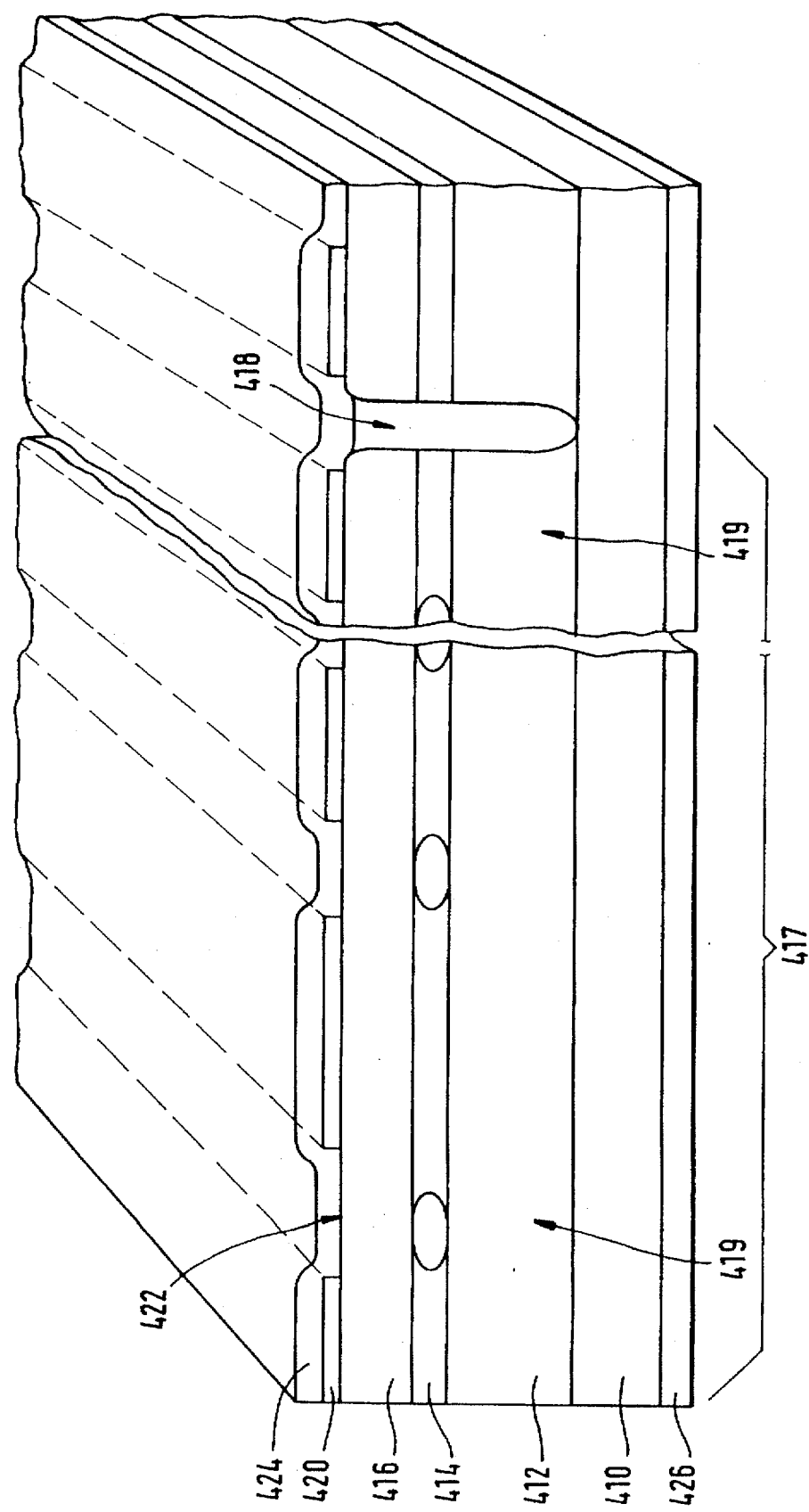
FIG. 18 is a schematic illustration of an embodiment of a semiconductor component, produced according to a first embodiment of the inventive process

As illustrated in FIG. 18, a semiconductor diode laser comprises a substrate 410 which is, first of all, mechanically cleaned and then fed to the photolytic cleaning unit 10 as substrate 12. In this photolytic cleaning unit, a layer of one or more angstroms in thickness is then removed and the substrate 12, which is, for example, a disk consisting of GaAs, activated.

The cleaned substrate 12a is now introduced into the coating unit 18 through the channel 20.

First of all, a series of layers 412 of doped semiconductor material is applied to the substrate 410 in the coating station 12 alternatingly by changing between two individual targets 130a and 130b, whereby the individual target 130a comprises, for example, GaAs: Si and the individual target 130b GaAlAs: Si.

It is, however, conceivable to produce the individual target 130a from GaAs, the individual target 130b from GaAlAs and the individual target 130c from Si and, therefore, to change from the respective individual target 130a or 130b to the individual target 130c with Si for the purpose of doping the respective material with Si.

Each individual layer of the series of layers 412 has a thickness in the order of several 10 nm.

This series of layers 412 is followed by a recombination zone 414 which is built up from GaAlAs: Si and, subsequently, GaAlAs without doping.

These layers are also applied in the coating station 22.

This is followed by the application of a P-doped series of layers 416 consisting of GaAlAs doped with, e.g., Mg.

In order to separate a plurality of semiconductor lasers seated next to one another, the layers 416, 414 and 412 are removed in the structuring station 24, as illustrated in FIG. 18, in the form of strips 418 extending parallel to one another. A row 417 of semiconductor lasers 419 lying next to one another is therefore located between each strip 418.

Subsequently, an insulator layer 420 is applied to the uppermost layer of the series of layers 414 in a further coating station 22, whereby a single individual target having a suitable insulator material is possible as target material.

In an additional structuring station 24, a strip-like removal of the insulating material takes place in a contacting strip 422, whereby a contacting strip of this type belongs to each individual laser so that a plurality of contacting strips 422 extend next to one another between the strips 418 and spaced from as well as parallel to one another.

Finally, a metal layer 424 is applied as uppermost layer which, on the one hand, rests on the insulator material 420 next to the strips 422 and is therefore insulated in this region relative to the P-doped series of layers whereas, in the region of the contacting strips 422, the metal layer 424 rests directly on the P-series of layers 416 and therefore allows current to be supplied thereto in this region.

The metal layer 424 is also preferably applied by a coating apparatus similar to FIG. 4 in the metallizing station 40. Due to the direct contacting of the P-series of layers in the contacting strips 422, a laser activity in the recombination series of layers 414 is possible beneath the respective contacting strip 422.

In the same way, a metal layer 426 is applied to the underside of the base substrate 12a.

This results in the functional structure of the semiconductor laser.

The contacting of the metal layers 424 and 426 is brought about, on the one hand, by soldering on a wire and, on the other hand, by soldering the entire semiconductor laser row onto a copper block, for example with the metal layer 426.

In a second embodiment of an inventive process for producing a semiconductor component, in this case an electroluminescent element, illustrated in FIG. 19, an electroluminescent layer is produced, for example for flat display elements or flat screens.

In this respect, a substrate 430 which represents a glass substrate is likewise cleaned first of all in the conventional manner and then a layer of 1 or 2 angstroms in thickness is removed with the laser beam 14 in the photolytic cleaning unit 10 for activating the glass.

Subsequently, the substrate 12a is transported into the coating unit 18 to the first coating station 22. In the first coating station 22, a transparent and electrically conductive layer 432 is applied to the process substrate 12b and this layer has, for example, a thickness of 150 nm.

In a second coating station, an insulator layer 434 is applied to the process substrate 12b.

Then, the application of a luminescent layer 436 with doping follows in an additional coating station and, finally, the application of an insulation layer 438 to this luminescent layer 436 in a further coating station or return transport to the coating station provided for the application of the insulator layer 434.

Finally, individual layer regions 440 are applied as uppermost layer, namely as structured layer, and these regions have a line form, as illustrated by way of example in FIG. 19. These layer regions 440 are designed as metal layers and represent contact elements for activating the electroluminescent element.

The layer regions 440 are, however, designed, in other forms of realizing an electroluminescent element, as matrix-type contact strips which determine the activating structure of the electroluminescent element.

Thus, the functional structure of an electroluminescent element is likewise produced and so only an outer contacting must still take place.

What is claimed is:

1. A method for producing a semiconductor device having its functionality determined by a plurality of layers provided on a substrate, said method using solely physical processes to produce said layers without any substances other than the materials from which said layers are formed, comprising the steps of:

producing at least one of said layers of said semiconductor device using laser radiation comprising laser pulses with a duration of less than approximately 100 picoseconds, said laser pulses acting on a target material to generate a plasma of said target material for depositing a controlled portion of the target material; and structuring at least one of the layers of said semiconductor device after that layer has been deposited using laser radiation comprising laser pulses with a duration of less than approximately 100 picoseconds, said laser pulses acting thereon to remove a portion of the layer in a controlled manner to achieve a desired structure;

wherein all of the layers contributing to the functionality of said semiconductor device, including said structured layer(s), are produced exclusively by at least one of said depositing and structuring steps without requiring environmentally burdensome chemicals.

2. A method in accordance with claim 1 wherein at least one layer produced by said producing step is formed using laser radiation acting on a predefined area of said target material to deposit a portion of the target material on a predefined area of said semiconductor device to form a structured layer.

3. A method in accordance with claim 2 wherein a portion of at least one structured layer formed by said producing step is removed during said structuring step to further structure that structured layer.

4. A method in accordance with claim 2 wherein:

said producing step is performed a plurality of times to produce at least one unstructured layer and at least one structured layer; and said structuring step removes a portion of at least one of said layers produced by said producing step.

5. A method in accordance with claim 1 wherein said producing step is used to apply an unstructured layer on a surface of said semiconductor device by using laser radiation acting on a target material to deposit the target material on substantially the entire surface area of said surface.

6. A method in accordance with claim 5 wherein said unstructured layer is produced using a thick-layer target material.

7. A method in accordance with claim 6 wherein said laser radiation causes a plasma to form when it impinges said thick-layer target material.

8. A method in accordance with claim 7 wherein particles from said thick-layer target material migrate toward said substrate in the form of a cone.

9. A method in accordance with claim 1 wherein said producing step produces at least one structured layer by depositing a plurality of adjacent partial layers in a controlled manner.

10. A method in accordance with claim 1 wherein each layer is produced with a composition that is ready to serve the intended function of that layer.

11. A method in accordance with claim 10 wherein the composition of each layer results from a build up of individual components of layer material.

12. A method in accordance with claim 11 wherein said individual components of layer material are provided by a plurality of individual targets acted upon by laser radiation.

13. A method in accordance with claim 1 comprising the further step of moving a focus of laser radiation relative to said target material during said producing step to deposit controlled portions of the material on said semiconductor device.

14. A method in accordance with claim 1 comprising the further step of moving said target material relative to said substrate during said producing step to deposit controlled portions of the material on said semiconductor device.

15. A method in accordance with claim 1, wherein:

said laser pulses are provided at a time interval of approximately 0.5 to approximately 5.0 nanoseconds.

16. A method for producing a semiconductor device having its functionality determined by a plurality of structured layers provided on a substrate, said method using solely physical processes to produce said structured layers without any substances other than the materials from which said structured layers are formed, comprising the steps of:

structuring said substrate using laser radiation comprising laser pulses with a duration of less than approximately 100 picoseconds, said laser pulses acting thereon to remove a portion of the substrate in a controlled manner to achieve a substrate layer of a desired structure; and producing at least one additional structured layer on said substrate using laser radiation comprising laser pulses with a duration of less than approximately 100 picoseconds, said laser pulses acting on a target material to deposit a controlled portion of the target material on said substrate.

17. A method in accordance with claim 16 comprising the further step of:

structuring said additional layer after the layer has been deposited using laser radiation acting thereon to remove a portion of the additional layer in a controlled manner to achieve a desired structure.

18. A method in accordance with claim 16 wherein said additional layer overlaps said substrate layer.

19. A method in accordance with claim 16 comprising the further step of:

applying an unstructured layer on a surface of said semiconductor device by using laser radiation acting on a target material to deposit the target material on substantially the entire surface area of said surface.

20. A method in accordance with claim 19 wherein said unstructured layer is produced using a thick-layer target material.

21. A method in accordance with claim 20 wherein said laser radiation causes a plasma to form when it impinges said thick-layer target material.

22. A method in accordance with claim 21 wherein particles from said thick-layer target material migrate toward said substrate in the form of a cone.

23. A method in accordance with claim 16 wherein said producing step produces the additional structured layer by depositing a plurality of adjacent partial layers in a controlled manner.

24. A method in accordance with claim 16 wherein the additional structured layer is produced with a composition that is ready to serve the intended function of that layer.

25. A method in accordance with claim 24 wherein the composition of each layer results from a build up of individual components of layer material.

26. A method in accordance with claim 25 wherein said individual components of layer material are provided by a plurality of individual targets acted upon by laser radiation.

27. A method in accordance with claim 16 comprising the further step of moving a focus of laser radiation relative to said target material during said producing step to deposit controlled portions of the material on said semiconductor device.

28. A method in accordance with claim 16 comprising the further step of moving said target material relative to said substrate during said producing step to deposit controlled portions of the material on said semiconductor device.

29. A method for producing a semiconductor device having its functionality determined by a plurality of structured layers provided on a substrate, said method using solely physical processes to produce said structured layers without any substances other than the materials from which said structured layers are formed, comprising the steps of:

structuring said substrate using laser radiation comprising laser pulses with a duration of less than approximately 100 picoseconds, said laser pulses acting on said substrate to remove a portion of said substrate in a controlled manner to achieve a substrate layer of a desired structure; and producing at least one additional unstructured layer on said substrate using laser radiation comprising laser pulses with a duration of less than approximately 100 picoseconds, said laser pulses acting on a target material to generate a plasma of said target material for depositing a portion of the target material on said substrate.

30. A method in accordance with claim 29, wherein:

said laser pulses are provided at a time interval of approximately 0.5 to approximately 5.0 nanoseconds.

* * * * *